United States Patent
Kato et al.

(10) Patent No.: US 7,596,024 B2
(45) Date of Patent: Sep. 29, 2009

(54) NONVOLATILE MEMORY

(75) Inventors: Kiyoshi Kato, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 98 days.

(21) Appl. No.: 11/776,973

(22) Filed: Jul. 12, 2007

(65) Prior Publication Data

US 2008/0049500 A1 Feb. 28, 2008

(30) Foreign Application Priority Data

Jul. 14, 2006 (JP) .............................. 2006-194660

(51) Int. Cl.
*G11C 16/04* (2006.01)
(52) U.S. Cl. .............................. 365/185.11; 365/185.28
(58) Field of Classification Search ............ 365/185.11, 365/185.28, 230.04
See application file for complete search history.

(56) References Cited

U.S. PATENT DOCUMENTS

| | | | |
|---|---|---|---|
| 4,847,211 A | 7/1989 | Lee | |
| 5,648,930 A | 7/1997 | Randazzo | |
| 5,740,106 A | 4/1998 | Nazarian | |
| 5,793,344 A | 8/1998 | Koyama | |
| 5,812,450 A | 9/1998 | Sansbury et al. | |
| 5,888,868 A | 3/1999 | Yamazaki et al. | |
| 6,054,734 A | 4/2000 | Aozasa et al. | |
| 6,157,575 A | 12/2000 | Choi | |
| 6,165,824 A | 12/2000 | Takano et al. | |
| 6,169,307 B1* | 1/2001 | Takahashi et al. ........... | 257/315 |
| 6,198,125 B1 | 3/2001 | Yamazaki et al. | |
| 6,272,044 B2 | 8/2001 | Yamamoto et al. | |

(Continued)

FOREIGN PATENT DOCUMENTS

| | | |
|---|---|---|
| JP | 10-247735 | 9/1998 |
| JP | 2002-043447 | 2/2002 |

OTHER PUBLICATIONS

Japan 10-247735: English abstract provided by esp@cenet Worldwide (2007) and family to U.S. Patent No. 6,165,824 (Desig. ID "AI") and U.S. Patent No. 6,479,333 (Desig. ID "AN").

Japan 2002-043447: English abstract provided by esp@cenet Worldwide (2007) and family to U.S. Patent No. 6,577,531 (Desig. ID "AO") and U.S. Patent Application Publication No. 2003/0202382 (Desig. ID AQ).

William S. Johnson et al.; "A 16Kb Electrically Erasable Nonvolatile Memory"; *Nonvolatile Semiconductor Memories Technologies, Design, and Applications*, pp. 125-127; 1980.

*Primary Examiner*—Vu A Le
(74) *Attorney, Agent, or Firm*—Fish & Richardson P.C.

(57) ABSTRACT

A highly-integrated nonvolatile memory. A memory cell array where plural memory cells are arranged in matrix in row and column directions, plural first and second word lines, and plural bit lines are included. Each of the plural memory cells includes a first memory transistor and a second memory transistor which are connected in series. A gate electrode of the first memory transistor is connected to the first word line, a gate electrode of the second memory transistor is connected to the second word line, one of source and drain regions of the first memory transistor is connected to the first bit line, and one of source and drain regions of the second memory transistor is connected to the second bit line. Each of the first bit line and the second bit line is provided in common for memory cells in columns which are adjacent to each other.

24 Claims, 15 Drawing Sheets

U.S. PATENT DOCUMENTS

| | | |
|---|---|---|
| 6,472,684 B1 | 10/2002 | Yamazaki et al. |
| 6,479,333 B1 | 11/2002 | Takano et al. |
| 6,577,531 B2 * | 6/2003 | Kato .................... 365/185.01 |
| 6,667,494 B1 | 12/2003 | Yamazaki et al. |
| 2003/0202382 A1 | 10/2003 | Kato |
| 2007/0140039 A1 * | 6/2007 | Iioka .................... 365/230.06 |

* cited by examiner

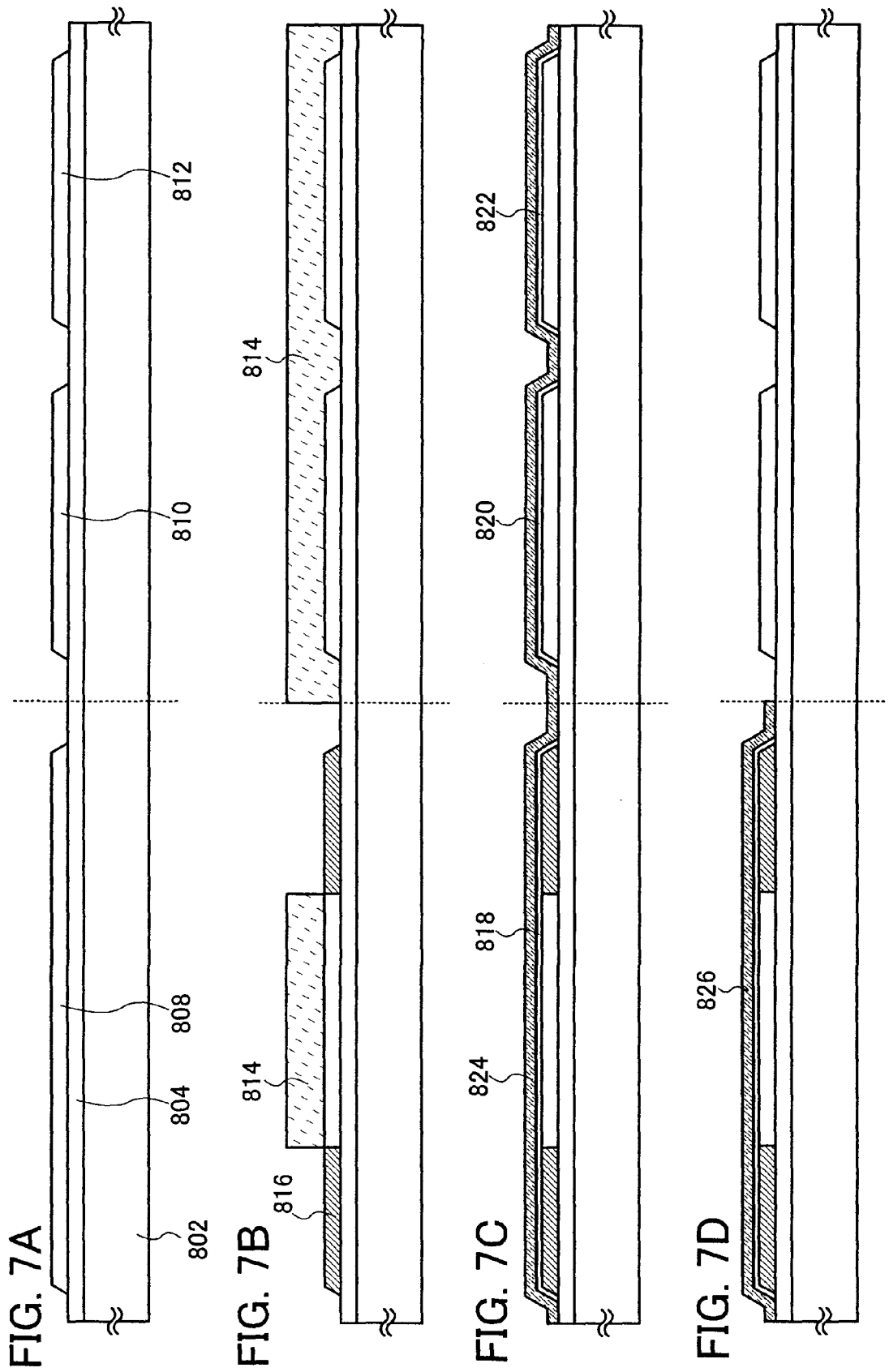

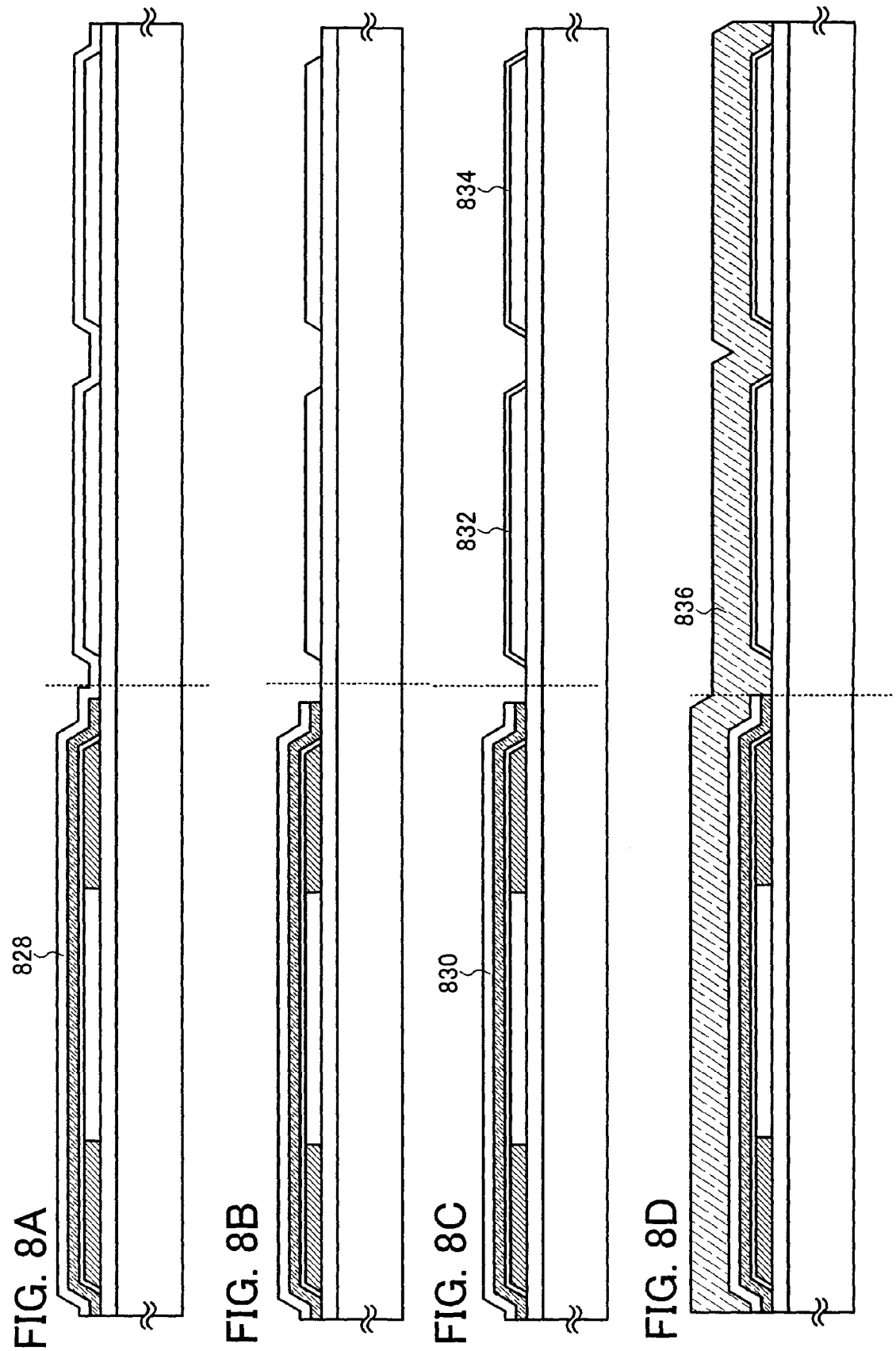

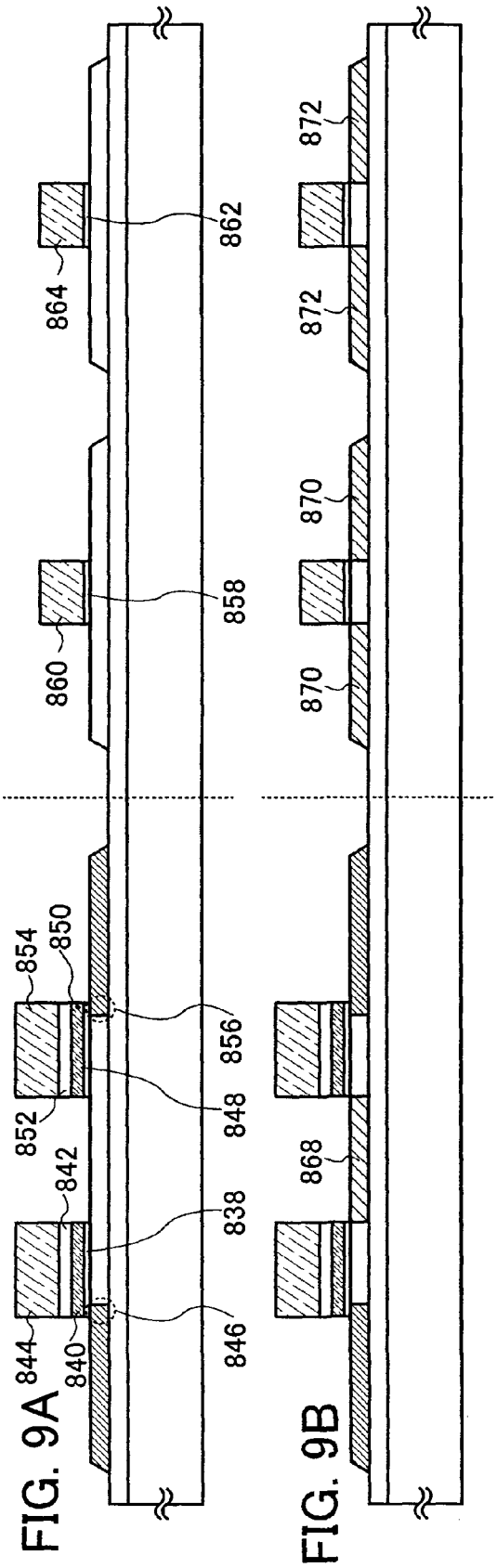
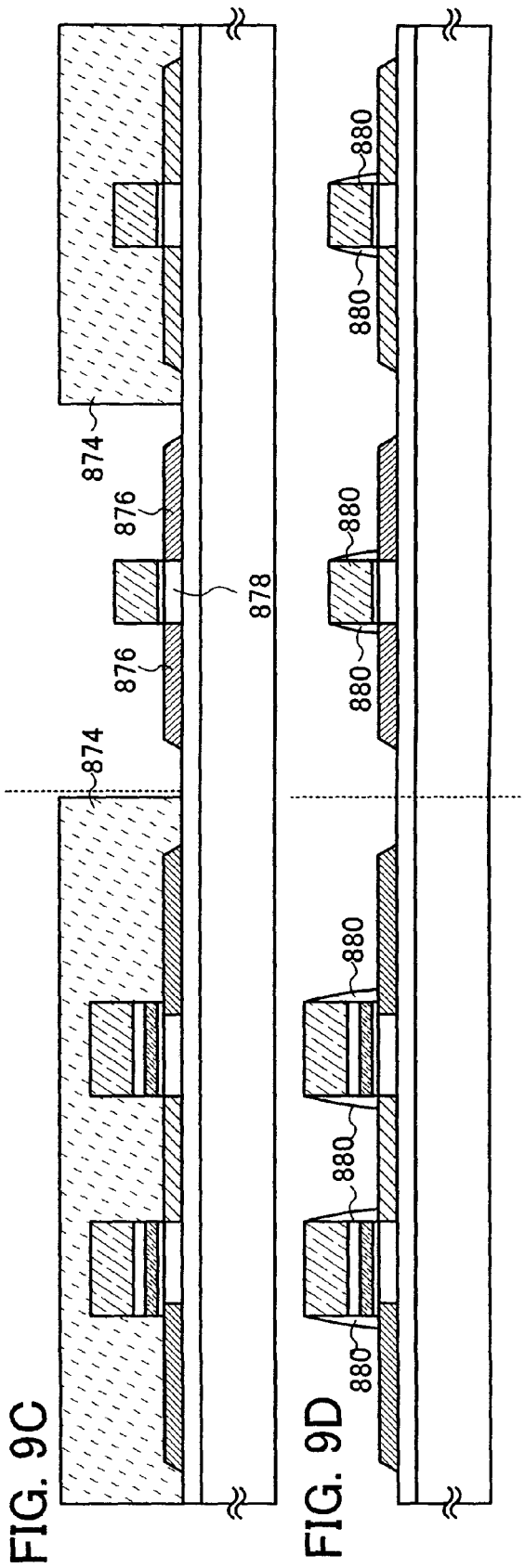

NONVOLATILE MEMORY

BACKGROUND OF THE INVENTION

1. Field of the Invention

The present invention relates to a semiconductor nonvolatile memory. In particular, the present invention relates to an electrically writable and erasable semiconductor nonvolatile memory (EEPROM: Electrically Erasable and Programmable Read Only Memory).

2. Description of the Related Art

In recent years, there has rapidly spread a small semiconductor device with multiple functions and high performance, which is represented by a mobile appliance such as a mobile computer or a mobile phone. Accordingly, a semiconductor nonvolatile memory has been noted as a memory included in a semiconductor device. The semiconductor nonvolatile memory is characteristically superior in integration density, shock resistance, power consumption, writing/reading speed, or the like while it is inferior in storage capacity, to a magnetic disk. In recent years, there has been developed a semiconductor nonvolatile memory which has sufficient performance of the frequency of rewriting data and the time period for holding data, that had been problems of the semiconductor nonvolatile memory, and there has been a trend to employ the semiconductor nonvolatile memory in place of the magnetic disk.

Semiconductor nonvolatile memories are roughly classified into two classes: a full-function EEPROM and a flash memory. A full-function EEPROM is a semiconductor nonvolatile memory which is capable of erasing data for each bit, and can perform writing, reading, and erasing operations for each bit. The full-function EEPROM has higher functions while it is inferior in integration degree and cost as compared to the flash memory. On the other hand, a flash memory is a semiconductor nonvolatile memory for erasing all data of the memory in a batch or erasing data for each block unit of the memory, thereby realizing high integration density and low cost while giving up an erasing operation for each bit.

In the case of the flash memory, all data is necessarily erased to rewrite data for one bit. This makes the power consumption larger than that of the full-function EEPROM and lowers the reliability because data is rewritten even in a memory cell where data rewriting is not needed. Of course, the flash memory cannot be used for an application that needs an erasing operation for each bit.

Here, a full-function EEPROM is taken as an example of a conventional semiconductor nonvolatile memory, and a circuit diagram thereof and a cross-sectional view and a driving method of a memory cell thereof are described.

FIG. 12 is a circuit diagram of a conventional full-function EEPROM. The full-function EEPROM shown in FIG. 12 includes a memory cell array 405 in which a plurality of memory cells (1, 1) to (m, n) are arranged in matrix so as to be m memory cells in column and n memory cells in row, an X address decoder 401, a Y address decoder 402, and other peripheral circuits 403 and 404.

Each memory cell (typically, a memory cell (i, j) is considered) (i is an integer which is greater than or equal to 1 and less than or equal to m, and j is an integer which is greater than or equal to 1 and less than or equal to n) includes an n-channel memory transistor Tr1 and an n-channel selection transistor Tr2. The two transistors are connected in series. A source electrode and a control gate electrode of the memory transistor Tr1 are connected to a source line Si and a word line Wj, respectively. A drain electrode and a gate electrode of the selection transistor Tr2 are connected to a bit line Bi and a selection line Vj, respectively. Further, bit lines B1 to Bn are connected to the Y address decoder 402, and word lines W1 and Wm and selection lines V1 to Vm are connected to the X address decoder 401. A predetermined potential Vs is applied to source lines S1 to Sn in common.

In the case where 1-bit data is stored in each memory transistor included in each memory cell, the full-function EEPROM shown in FIG. 12 has storage capacity of m×n bits.

However, the full-function EEPROM has a problem in that a memory cell area is large and the integration density is low because each memory cell in which 1-bit data is stored includes two transistors, that are the memory transistor and the selection transistor. This obstructs reduction in size and cost of the full-function EEPROM.

For solving the above-described problem, a structure for improving the integration density by providing one more memory transistor instead of a selection transistor in each memory cell in which 1-bit data is stored, and the like have been proposed (e.g., Japanese Published Patent Application No. 2002-43447). Further, in recent years, a memory element has been utilized in various fields, and smaller and mobile nonvolatile memory having large capacity has been demanded.

SUMMARY OF THE INVENTION

It is an object of the present invention to provide a nonvolatile memory which is capable of realizing higher integration.

A nonvolatile memory of the present invention includes a memory cell array in which a plurality of memory cells are arranged in matrix in row and column directions, a plurality of first word lines, a plurality of second word lines, and a plurality of bit lines. Each of the plurality of memory cells includes a first memory transistor and a second memory transistor which are connected in series. A gate electrode of the first memory transistor is connected to the first word line, a gate electrode of the second memory transistor is connected to the second word line, one of a source region and a drain region of the first memory transistor is connected to a first bit line, one of a source region and a drain region of the second memory transistor is connected to a second bit line, and each of the first bit line and the second bit line is provided in common for memory cells in columns which are adjacent to each other. Note that providing each bit line in common for memory cells in columns which are adjacent to each other means that one bit line is provided between memory cells in a column (the j-th column) and memory cells in a column which is adjacent to the column (the j+1)th column), thereby electrically connecting to both of memory transistors provided in the memory cells in the j-th column and memory transistors provided in the (j+1)th column.

Further, a nonvolatile memory of the present invention includes a memory cell array in which a plurality of memory cells are arranged in matrix in row and column directions, a plurality of first word lines, a plurality of second word lines, and a plurality of bit lines in which a first bit line and a second bit line provided to be adjacent to each other are included. Each of the plurality of memory cells includes a first memory transistor and a second memory transistor which are connected in series. A gate electrode of the first memory transistor is connected to the first word line, a gate electrode of the second memory transistor is connected to the second word line, one of a source region and a drain region of the first memory transistor is connected to the first bit line, and one of a source region and a drain region of the second memory transistor is connected to the second bit line. To be concrete, the first bit line is connected to one of a source region and a drain region of each second memory transistor provided in the memory cells in the (j−1)th column and one of a source region and a drain region of each first memory transistor provided in the memory cells in the j-th column. The second bit line is connected to one of a source region and a drain region of each second memory transistor provided in the memory cells in the j-th column and one of a source region and a drain region of each first memory transistor provided in the memory cells in the (j+1)th column.

Further, the nonvolatile memory of the present invention is capable of writing data for each bit and erasing data for each bit. Further, data writing and data erasing for each memory cell can be performed by tunneling current.

Note that in the nonvolatile memory of the present invention, each wiring in a column direction, connected to the memory cells is referred to as a bit line. The nonvolatile memory of the present invention does not include a source line, and a source region of each transistor, which has been connected to the source line in the conventional full-function EEPROM, is connected to the bit line which is adjacent thereto.

In the nonvolatile memory of the present invention, a memory cell includes two memory transistors, a conventional source line is excluded, and each memory transistor is connected to a bit line which is adjacent thereto instead of the conventional source line. Accordingly, a full-function EEPROM of which integration density is high, size is small, and cost is low can be provided.

BRIEF DESCRIPTION OF THE DRAWINGS

FIGS. 7A to 7D show one example of a manufacturing method of a nonvolatile memory of the present invention.

FIGS. 8A to 8D show one example of a manufacturing method of a nonvolatile memory of the present invention.

FIGS. 9A to 9D show one example of a manufacturing method of a nonvolatile memory of the present invention.

DETAILED DESCRIPTION OF THE INVENTION

Figure 1:
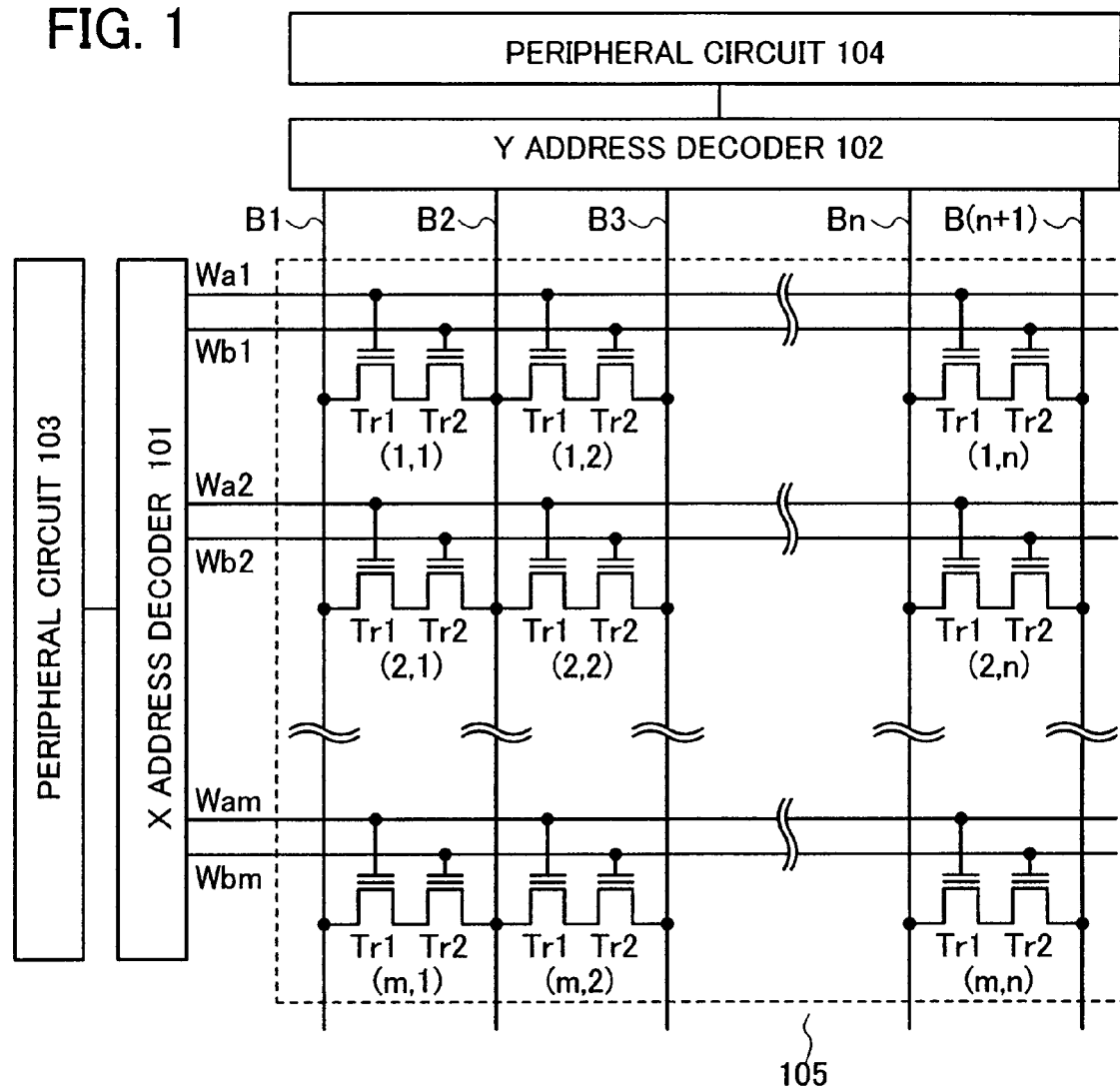
FIG. 1 shows one example of a nonvolatile memory of the present invention.

Although the present invention will be fully described by way of embodiment modes with reference to the accompanying drawings, it is to be understood that various changes and modifications will be apparent to those skilled in the art. Therefore, unless such changes and modifications depart from the purpose and scope of the present invention, they should be construed as being included therein. Note that in structures of the present invention described below, reference numerals may be used in common through the drawings.

Embodiment Mode 1

This embodiment mode describes a circuit diagram, a driving method, and a cross-sectional structure of a memory cell, of a nonvolatile memory of the present invention.

FIG. 1 shows circuits of a nonvolatile memory described in this embodiment mode. Shown as an example here is a circuit diagram of a (m×n)-bit nonvolatile memory (m and n are integers which are greater than or equal to 1).

The nonvolatile memory described in this embodiment mode includes a memory cell array 105 in which (m×n) memory cells (1, 1) to (m, n) are arranged in matrix so as to be m memory cells in row and n memory cells in column, an X address decoder 101 and a Y address decoder 102 which are driver circuits of the memory cell array 105, and other peripheral circuits 103 and 104.

Each memory cell (typically, a memory cell (i, j) is considered) (i is an integer which is greater than or equal to 1 and less than or equal to m, and j is an integer which is greater than or equal to 1 and less than or equal to n) includes two memory transistors Tr1 and Tr2. The two transistors Tr1 and Tr2 are connected in series. A gate electrode of the memory transistor Tr1 is connected to a first word line Waj and a gate electrode of the memory transistor Tr2 is connected to a second word line Wbj.

Further, in the nonvolatile memory described in this embodiment mode, each wiring which functions as a bit line is in common in memory cells which are adjacent to each other in each row. That is, in one row (e.g., the i-th row), a source electrode of the memory transistor Tr1 in the j-th column and a drain electrode of the memory transistor Tr2 in the (j−1)th column are connected to the same wiring (j-th bit line), and a source electrode of the memory transistor Tr1 in the j+1)th column and a drain electrode of the memory transistor Tr2 in the j-th column are connected to the same wiring ((j+1)th bit line).

By providing each wiring so as to be in common in memory cells which are adjacent to each other, higher integration density of memory transistors can be performed, whereby reduction in size and increase in capacity of a nonvolatile memory can be realized.

In the case where 1-bit data is stored in each memory transistor, the nonvolatile memory of this embodiment mode has a storage capacity of (m×n×2) bits. The above-described other peripheral circuits include an address buffer circuit, a control logic circuit, a sense amplifier, a voltage step-up circuit, and the like, which are provided as needed.

Either an n-channel transistor or a p-channel transistor may be used as each of the memory transistors Tr1 and Tr2; and the case of using n-channel transistors is described in this embodiment mode. Further, described in this embodiment mode is the case where 1-bit data is stored in each memory transistor; however, each memory transistor can also store data which is greater than or equal to 2 bits by using multiple-value technology. In the case where k-bit data (k is an integer which is greater than or equal to 1) is stored in each memory transistor, the storage capacity of the nonvolatile memory of this embodiment mode is (m×n×2×k) bits.

Further, each memory transistor included in the nonvolatile memory may be provided using any substrate selected from a silicon substrate, an SOI substrate, and a substrate having an insulating surface. Further, by forming the driver circuits of the memory cells (in this embodiment mode, the X address decoder 101 and the Y address decoder 102) and the other peripheral circuits 103 and 104 over the same substrate as the memory transistors, a small nonvolatile memory can be realized.

In particular, in the case where the nonvolatile memory described in this embodiment mode includes a memory TFT (a TFT functioning as a memory element) formed over a substrate having an insulating surface, any component of a semiconductor device comprising a TFT can be formed over the same substrate, so that a small semiconductor device with multiple functions or high performance can be provided.

Figure 2:
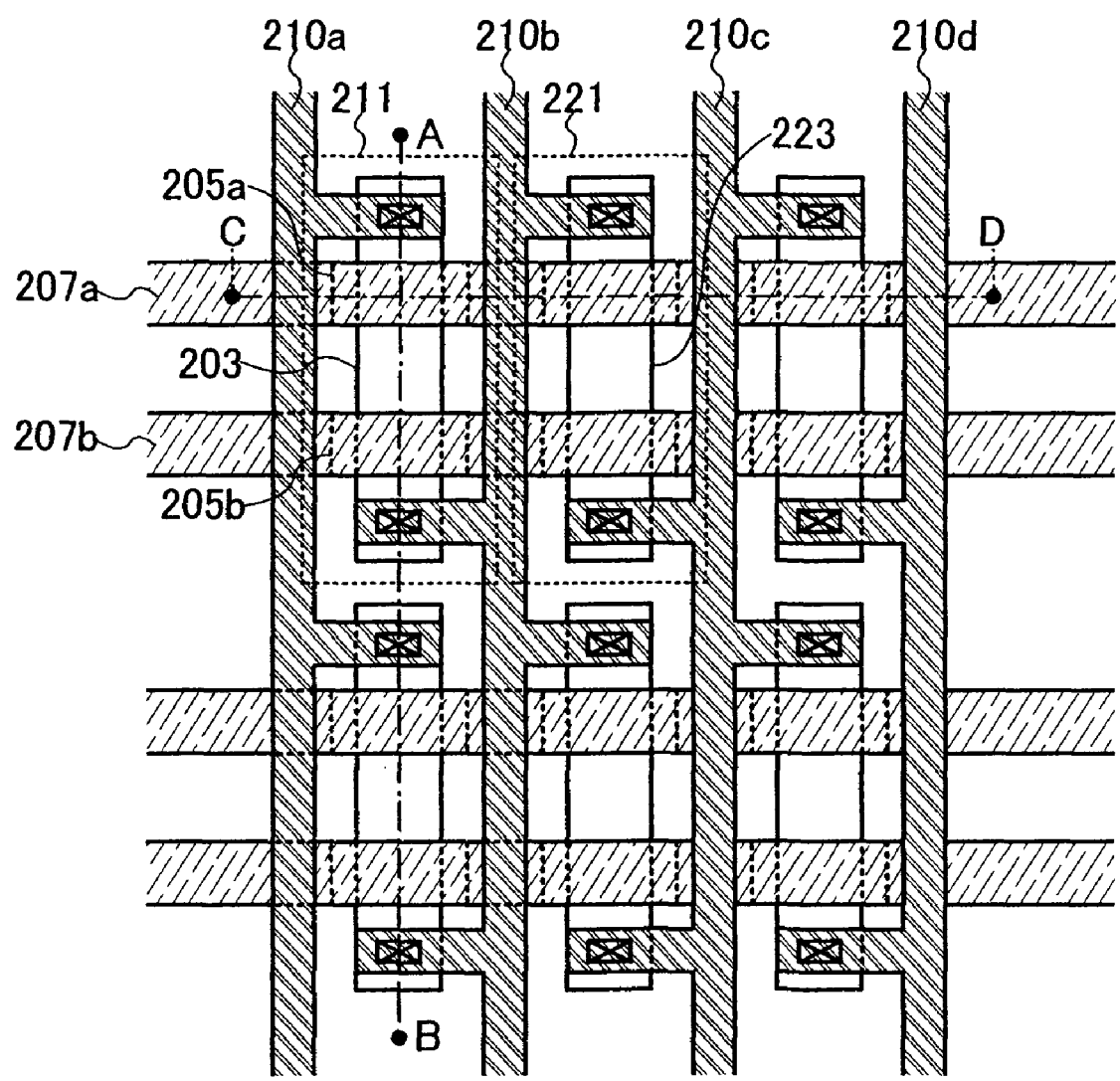
FIG. 2 shows one example of a nonvolatile memory of the present invention.
Figure 3A:
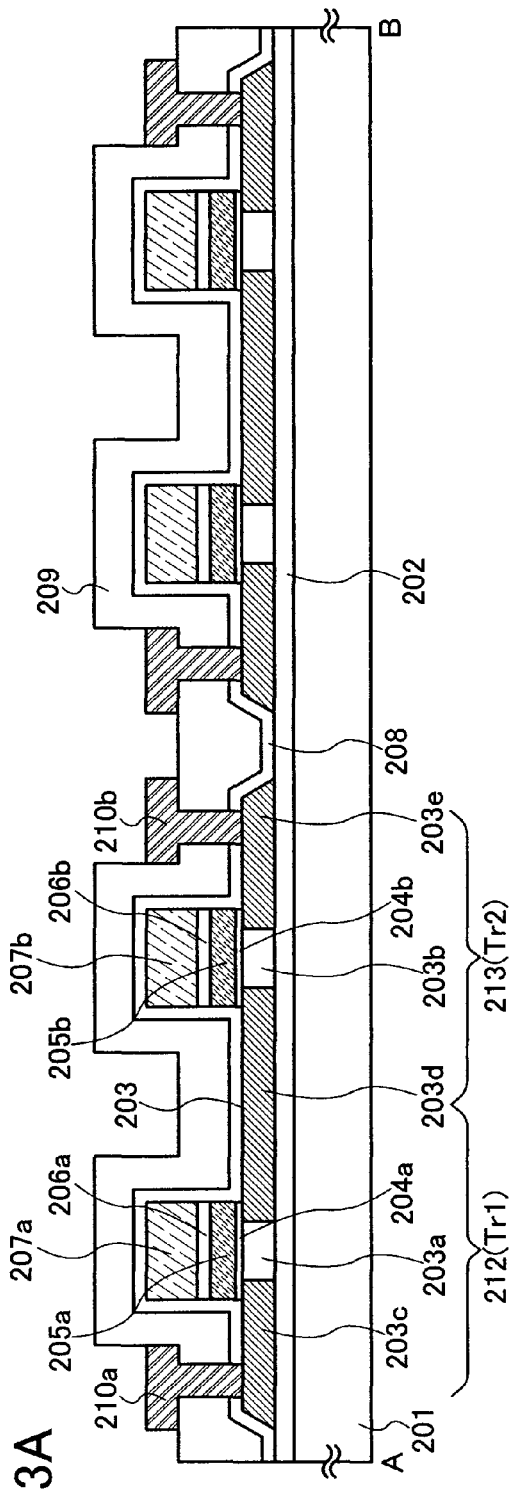
FIGS. 3A and 3B show one example of a nonvolatile memory of the present invention.
Figure 3B:
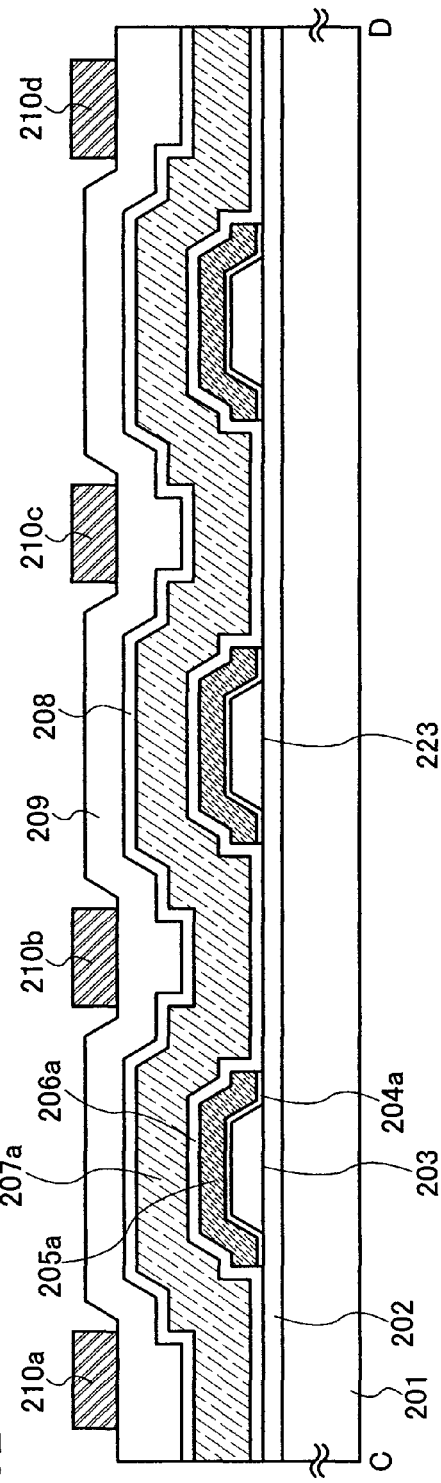

Next, one example of a memory cell included in the nonvolatile memory in this embodiment mode is described with reference to the drawings. FIG. 2 is a top view of the memory cell and FIGS. 3A and 3B are cross-sectional views of the memory cell. FIG. 3A is a cross-sectional view taken along a line A-B of FIG. 2 and FIG. 3B is a cross-sectional view taken along a line C-D of FIG. 2.

In the nonvolatile memory described in this embodiment mode, two memory transistors 212 and 213 included in a memory cell 211 are formed over a substrate 201 (see FIG. 3A). The memory transistor 212 comprises a semiconductor film 203 which is formed over the substrate 201 with an insulating film 202 interposed therebetween, a first insulating film 204a, a first conductive film 205a, a second insulating film 206a, and a second conductive film 207a. In the memory transistor 212, the semiconductor film 203 includes source and drain regions 203c and 203d and a channel formation region 203a.

Similarly, the memory transistor 213 comprises the semiconductor film 203 which is formed over the substrate 201 with the insulating film 202 interposed therebetween, a first insulating film 204b, a first conductive film 205b, a second insulating film 206b, and a second conductive film 207b. In the memory transistor 213, the semiconductor film 203 includes source and drain regions 203d and 203e and a channel formation region 203b.

Further, in a row direction (a direction which is parallel to the line C-D) in FIG. 2, each one of conductive films 210a to 210d, which functions as a bit line is provided between the semiconductor films 203, 223, and so on provided for memory cells respectively which are adjacent to each other, and each of the conductive films 210a to 210d is electrically connected to the semiconductor films which are adjacent to each other in the row direction. To be concrete, the conductive film 210b is provided between the semiconductor film 203 in the memory cell 211 and a semiconductor film 223 in a memory cell 221, thereby electrically connecting to the source or drain region 203e in the semiconductor film 203 and a source or drain region in the semiconductor film 223. That is, the conductive film 210b is provided in common between the memory cell 211 and the memory cell 221.

In this way, by providing each wiring which is connected to semiconductor films of memory cells which are adjacent to each other in the row direction, in common, higher integration density of the semiconductor films can be performed as compared to the case where each wiring is provided for each semiconductor film (see FIGS. 2 and 3B). For example, as compared to the case where a bit line and a source line which are independent for each column, an area can be reduced by the width of the source line and the distance between the source line and the bit line for each column. The wiring width is, for example, about 0.1 µm to 2 µm, and the distance between the wirings is, for example, about 0.1 µm to 2 µm, so that the width can be reduced by about 0.2 µm to 4 µm for each column.

Note that a second conductive film 207a in the memory transistor 212 corresponds to a first word line Wa, and a second conductive film 207b in the memory transistor 213 corresponds to a second word line Wb. In the memory transistors 212 and 213, first insulating films 204a and 204b can function as tunnel insulating films. First conductive films 205a and 205b can function as floating gate electrodes. Second insulating films 206a and 206b can function as control insulating films. The second conductive films 207a and 207b can function as control gate electrodes.

Further, insulating films 208 and 209 are formed so as to cover the memory transistors 212 and 213. The conductive films 210a and 210b which are electrically connected to the source or drain regions 203c and 203e in the semiconductor film 203 are provided over the insulating film 209.

Although described here is the example of the memory transistor of a thin film transistor type formed by providing a semiconductor active layer made of the island-shaped semiconductor film over the substrate 201, the present invention is not limited thereto. For example, a memory transistor can also be provided by using a semiconductor active region formed in a silicon substrate or a semiconductor active layer formed in an SOI (Silicon On Insulator) substrate.

Further, although described here is the example where each of the conductive films 210a to 210d is provided so as not to overlap the semiconductor film, they can also be provided so as to overlap the semiconductor film. In this case, by decreasing the distance between the semiconductor films which are adjacent to each other in the row direction, a memory cell area is reduced so that higher integration density of memory cells can be realized.

Further, the memory transistor 212 includes regions where the first conductive film 205a partially overlaps the source and drain regions 203c and 203d with the first insulating film 204a or the like interposed therebetween (overlap regions). An overlap region is a region through which tunneling current flows between the first conductive film which can function as the floating gate electrode and the source or drain region. Therefore, in the case where tunneling current is to flow between the source region and the first conductive film 205a, it is preferable to form an overlap region between the source region and the first conductive film 205a. In the case where tunneling current is to flow between the drain region and the first conductive film 205a, it is preferable to form an overlap region between the drain region and the first conductive film 205a. In accordance with a driving method of the nonvolatile memory, an overlap region may be provided either on one side of the source and drain regions or on both sides thereof in each of the memory transistors 212 and 213 as shown in FIG. 3A. Further, particularly in the case where tunneling current is to flow between the substrate (a body) and the first conductive film 205a, an overlap region is not necessarily provided.

The nonvolatile memory described in this embodiment mode has, compared to the conventional full-function EEPROM, characteristics in that the memory transistor having a memory function is used instead of the selection transistor and each wiring is provided in common between memory cells which are adjacent to each other in the row direction. Consequently, 2-bit data can be stored for each memory cell and data writing, reading, and erasing can be performed completely in a unit of one bit.

Further, writing and erasing operations of the nonvolatile memory described in this embodiment mode use tunneling current.

Respective operating methods of data writing, reading, and erasing of the memory transistors Tr1 and Tr2 are described below using the memory cell (i, j) as an example. Note that in the description below, data writing means electron injection into the floating gate electrode of the memory transistor whereas data erasing means discharge of electrons accumulated in the floating gate electrode of the memory transistor.

First, data writing into the memory transistor Tr1 in the memory cell (i, j) is described.

Figure 4A:
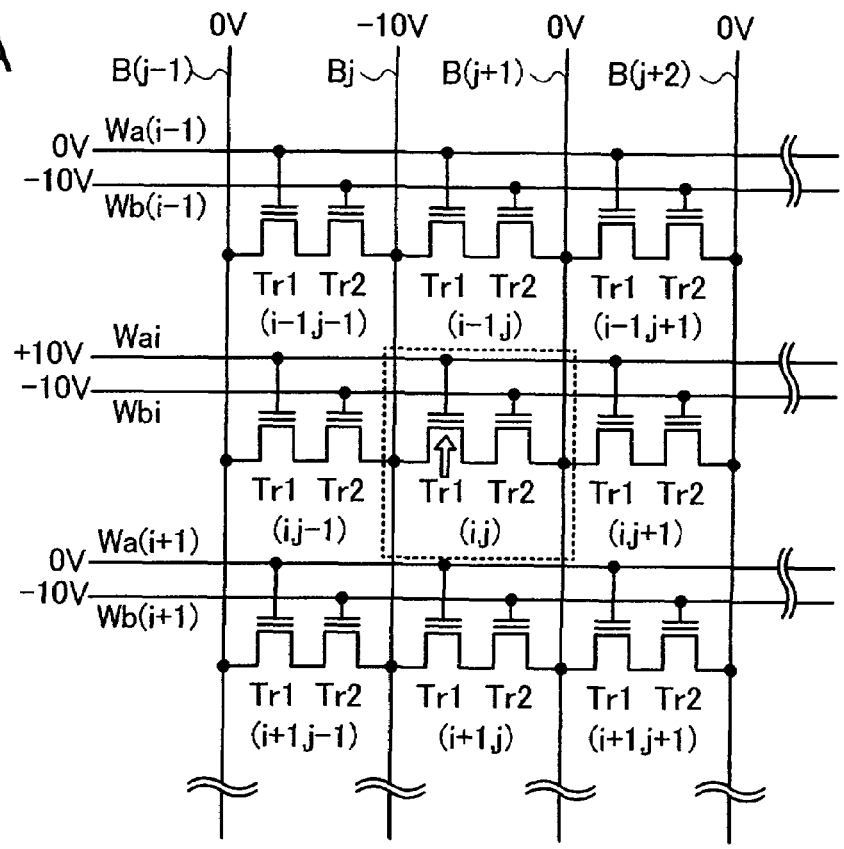
FIGS. 4A and 4B each show one example of an operation of a nonvolatile memory of the present invention.

In the case where data is written (electrons are injected) into the memory transistor Tr1, it is, for example, set as follows: the bit line Bj is at −10 V, the other bit lines Bk (k=1 to (j−1) and (j+1) to (n+1)) are at 0 V, the first word line Wai in the i-th row is at 10 V, the other first word lines Wak (k=1 to (i−1) and (i+1) to m) are at 0 V, and all second word lines Wbk (k=1 to m) are at −10 V (see FIG. 4A).

Consequently, in the memory cell (i, j), 10 V is applied to a gate electrode of the memory transistor Tr1 and −10 V is applied to a source or drain region thereof connected to the bit line Bj, whereby a large potential difference occurs. Then, electrons are injected from a channel region to the floating gate electrode by tunneling current, whereby data writing is performed.

Note that although there is a potential difference of 10 V between the bit line Bj and the other bit lines Bk (k=1 to (j−1) and (j+1) to (n+1)), by setting all the second word lines Wbk (k=1 to m) at −10 V, each memory transistor Tr2 in all of the memory cells is turned off, so that little current flows between the bit lines. Further, respective potential differences which may occur in the other memory transistors other than the memory transistor Tr1 in the memory cell (i, j) is at most about 10 V, so that data writing into another memory transistor by mistake does not happen.

Next, data writing into the memory transistor Tr2 in the memory cell (i, j) is described.

Figure 4B:
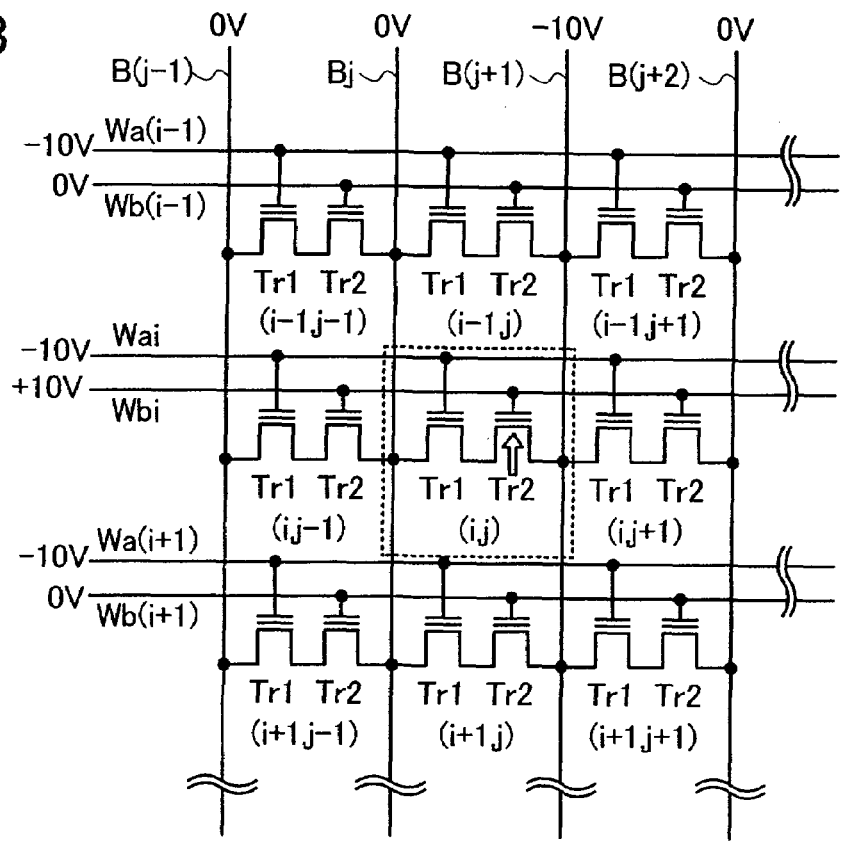

In the case where data is written (electrons are injected) into the memory transistor Tr2, it is, for example, set as follows: the bit line B(j+1) is at −10 V, the other bit lines Bk (k=1 to j and (j+2) to (n+1)) are at 0 V, all the first word lines Wak (k=1 to m) are at −10 V, the second word line Wbi in the i-th row is at 10 V, and the other second word lines Wbk (k=1 to (i−1) and (i+1) to m) are at 0 V (see FIG. 4B).

Consequently, in the memory cell (i, j), 10 V is applied to a gate electrode of the memory transistor Tr2 and −10 V is applied to a source or drain region thereof connected to the bit line B(j+1), whereby a large potential difference occurs. Then, electrons are injected from a channel region to the floating gate electrode by tunneling current, whereby data writing is performed.

Note that although there is a potential difference of 10 V between the bit line B(j+1) and the other bit lines Bk (k=1 to j and (j+2) to (n+1)), by setting all the first word lines Wak (k=1 to m) at −10 V, each memory transistor Tr1 in all of the memory cells is turned off, so that little current flows between the bit lines. Further, respective potential differences which may occur in the other memory transistors other than the memory transistor Tr2 in the memory cell (i, j) is at most about 10 V, so that data writing into another memory transistor by mistake does not happen.

Next, data erasing is described. First, data erasing from the memory transistor Tr1 in the memory cell (i, j) is described.

Figure 5A:
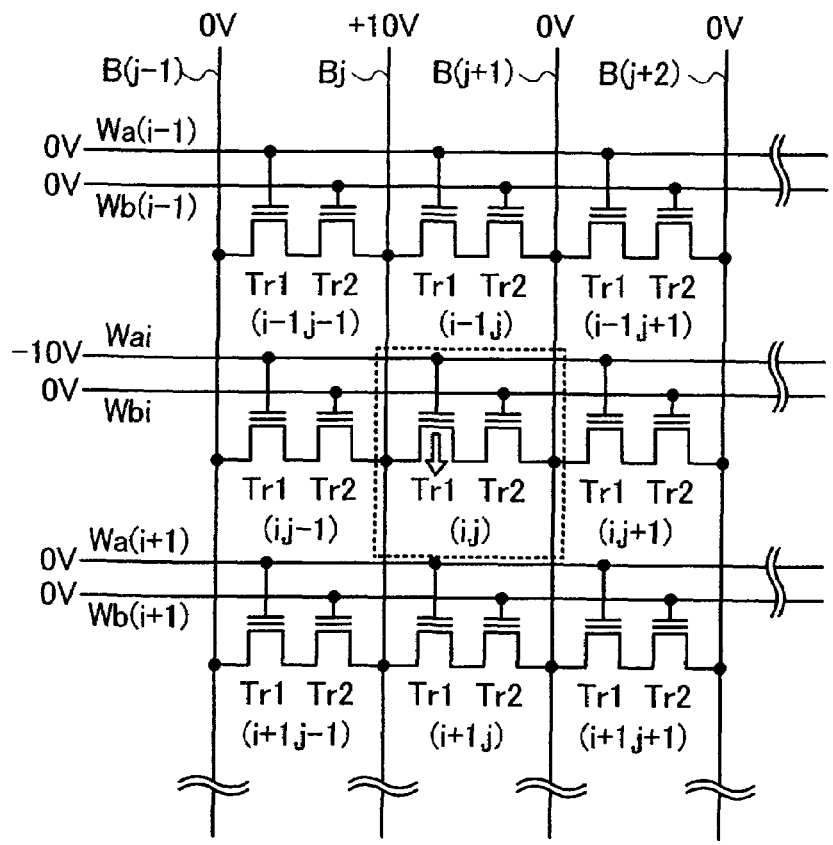
FIGS. 5A and 5B each show one example of an operation of a nonvolatile memory of the present invention.

In the case where data is erased (electrons are discharged) from the memory transistor Tr1, it is, for example, set as follows: the bit line Bj is at +10 V, the other bit lines Bk (k=1 to (j−1) and (j+1) to (n+1)) are at 0 V, the first word line Wai in the i-th row is at −10 V, the other first word lines Wak (k=1 to (i−1) and (i+1) to m) are at 0 V, and all the second word lines Wbk (k=1 to m) are at 0 V (see FIG. 5A).

Consequently, in the memory cell (i, j), −10 V is applied to the gate electrode of the memory transistor Tr1 and 10 V is applied to the source or drain region thereof connected to the bit line Bj, whereby a large potential difference occurs. Then, tunneling current flows through an overlap region, thereby electrons are discharged from the floating gate electrode to the source or drain region; that is, data erasing is performed.

Note that although there is a potential difference of 10 V between the bit line Bj and the other bit lines Bk (k=1 to (j−1) and (j+1) to (n+1)), by setting all the second word lines Wbk (k=1 to m) at 0 V, each memory transistor Tr2 in all of the memory cells is turned off, so that little current flows between the bit lines. Further, respective potential differences which may occur in the other memory transistors other than the memory transistor Tr1 in the memory cell (i, j) is at most about 10 V, so that data erasing from another memory transistor by mistake does not happen.

Figure 5B:
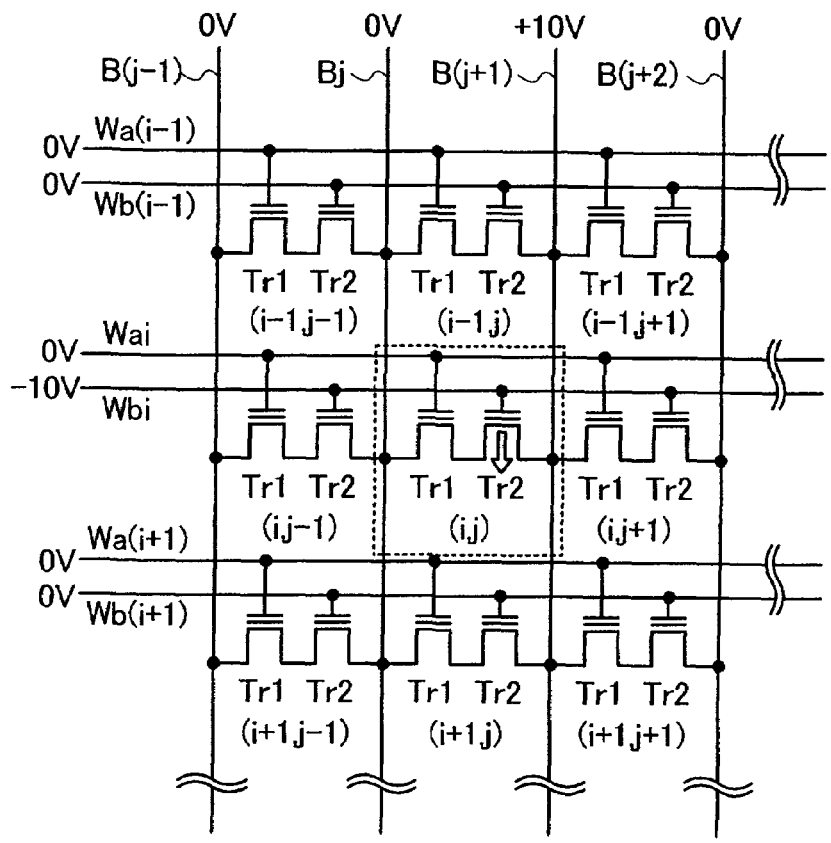

In the case where data is erased (electrons are discharged) from the memory transistor Tr2, it is, for example, set as follows: the bit line B(j+1) is at +10 V, the other bit lines Bk (k=1 to j and (j+2) to (n+1)) are at 0 V, all the first word lines Wak (k=1 to m) is at 0 V, the second word line Wbi in the i-th row is at −10 V, and the other second word lines Wbk (k=1 to (i−1) and (i+1) to m) is at 0 V (see FIG. 5B).

Consequently, in the memory cell (i, j), −10 V is applied to the gate electrode of the memory transistor Tr2 and 10 V is applied to the source or drain region thereof connected to the bit line B(j+1), whereby a large potential difference occurs. Then, tunneling current flows through an overlap region, thereby electrons are discharged from the floating gate electrode to the source or drain region; that is, data erasing is performed.

Note that although there is a potential difference of 10 V between the bit line B(j+1) and the other bit lines Bk (k=1 to j and (j+2) to (n+1)), by setting all the first word lines Wak (k=1 to m) at 0 V, each memory transistor Tr1 in all of the memory cells is turned off, so that little current flows between the bit lines. Further, respective potential differences which may occur in the other memory transistors other than the memory transistor Tr2 in the memory cell (i, j) is at most about 10 V, so that data erasing from another memory transistor by mistake does not happen.

Further, the nonvolatile memory described in this embodiment mode can perform the data writing or data erasing operation to a plurality of memory transistors at the same time. For example, such an operation can be performed to the memory transistors Tr1 in one row, the memory transistors Tr2 in one row, the memory transistors Tr1 in one column, the memory transistors Tr2 in one column, part of any of them, or the like. Further, the data writing or data erasing operation can be performed to all of the memory transistors Tr1 and Tr2 in one row, all of the memory transistors Tr1 and Tr2 in a plurality of rows, the memory transistors Tr1 in a plurality of rows, the memory transistors Tr2 in a plurality of rows, the memory transistors Tr1 in a plurality of columns, the memory transistors Tr2 in a plurality of columns, the memory transistors Tr1 in all of the memory cells, or the like.

For example, in the case where data writing is performed to the transistors Tr1 in the memory cells (i, k) (k=1 to (n+1)) in the i-th row at the same time, it may be set as follows: all the bit lines Bk (k=1 to (n+1)) are at −10 V, the first word line Wai is at 10 V, the other first word lines Wak (k=1 to (i−1) and (i+1) to m) are at 0 V, and all the second word lines Wbk (k=1 to m)

are at −10 V. Further, in the case where data erasing is performed to the transistors Tr2 in the memory cells (k, j) (k=1 to m) in the j-th column at the same time, it may be set as follows: the bit line B(j+1) is at 10 V, the other bit lines Bk ((k=1 to j and (j+2) to (n+1)) are at 0 V, all the first word lines Wak (k=1 to m) are at 0 V, and all the second word lines Wbk (k=1 to m) are at −10 V.

Figure 6A:
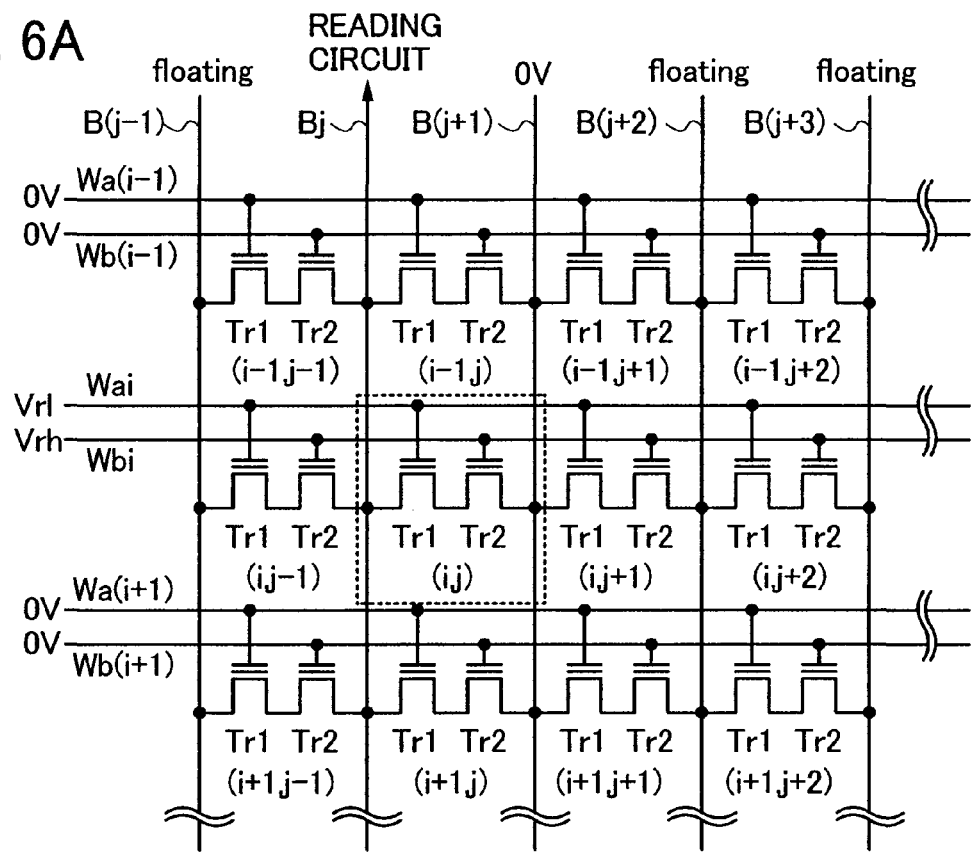
FIGS. 6A and 6B each show one example of an operation of a nonvolatile memory of the present invention.
Figure 6B:
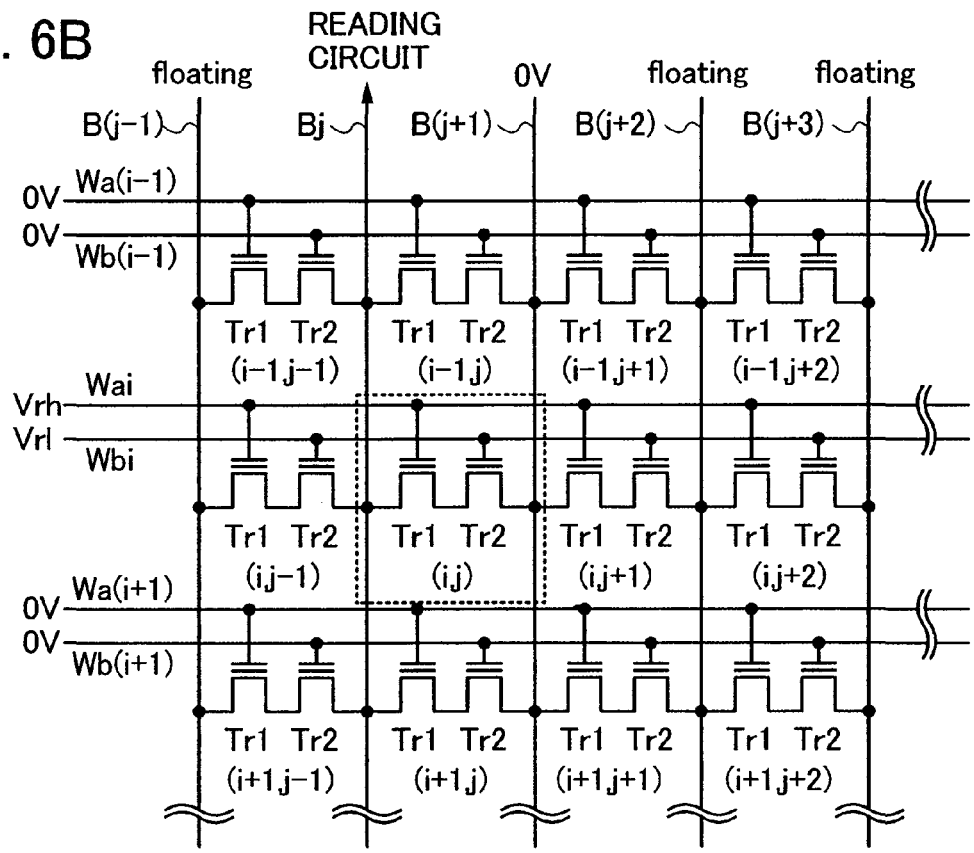

Subsequently, a data reading operation is described with reference to FIGS. 6A and 6B. First, data reading from the memory transistor Tr1 in the memory cell (i, j) is described.

In the case where data is read from the memory transistor Tr1, the bit line Bj is connected to a reading circuit, the bit line B(j+1) is set at 0 V, and the other bit lines Bk (k=1 to (j−1) and j+2) to (n+1)) are set in a floating state. In addition, the first word line Wai in the i-th row is set at Vrl (V), the second word line Wbi in the i-th row is set at Vrh (V), the other first word lines Wak (k=1 to (i−1) and (i+1) to m) are set at 0 V, and the other second word lines Wbk (k=1 to (i−1) and (i+1) to m) are set at 0 V (see FIG. 6A). Vrh (V) is selected so as to turn on a memory transistor regardless of whether data has been written or erased into/from the memory transistor (e.g., 4 to 8 V). Also, Vrl (V) is selected so as to turn off a memory transistor in the state where data has been written into the memory transistor and turn on the memory transistor in the state where data has been erased from the memory transistor (e.g., 2 to 4 V).

Consequently, the memory transistor Tr1 is turned off in the state where data has been written into the memory transistor Tr1, whereas both of the memory transistors Tr1 and Tr2 are turned on in the state where data has been erased from the memory transistor Tr1. That is, effective resistance of the memory cell (i, j) is largely changed. Therefore, by setting the bit line B(j+1) at 0 V and connecting the bit line Bj to the reading circuit, the state of the memory transistor Tr1 in the memory cell (i, j) can be read.

In the case where data is read from the memory transistor Tr2, the bit line Bj is connected to the reading circuit, the bit line B(j+1) is set at 0 V, and the other bit lines Bk (k=1 to (j−1) and j+2) to (n+1)) are set in the floating state. In addition, the first word line Wai in the i-th row is set at Vrh (V), the second word line Wbi in the i-th row is set at Vrl (V), the other first word lines Wak (k=1 to (i−1) and (i+1) to m) are set at 0 V, and the other second word lines Wbk (k=1 to (i−1) and (i+1) to m) are set at 0 V (see FIG. 6B). Vrh (V) is selected so as to turn on a memory transistor regardless of whether data has been written or erased into/from the memory transistor (e.g., 4 to 8 V). Vrl (V) is selected so as to turn off a memory transistor in the state where data has been written into the memory transistor and turn on the memory transistor in the state where data has been erased from the memory transistor (e.g., 2 to 4 V).

Consequently, the memory transistor Tr2 is turned off in the state where data has been written into the memory transistor Tr2, whereas both of the memory transistors Tr1 and the memory transistor Tr2 are turned on in the state where data has been erased from the memory transistor Tr2. That is, the effective resistance of the memory cell (i, j) is largely changed. Therefore, by setting the bit line B(j+1) at 0 V and connecting the bit line Bj to the reading circuit, the state of the memory transistor Tr2 in the memory cell (i, j) can be read.

Note that the reading circuit is not particularly limited as long as difference in load resistance which is connected can be read. The reading circuit can perform resistive dividing, comparison of the charge amounts before and after precharge, or the like. In addition, all of the other bit lines Bk are in the floating state, thereby a reading operation is not affected.

As described above, by employing a structure in which one memory cell includes two memory transistors and a source line is not included (instead of this, a bit line in a column which is adjacent to each memory transistor is connected), while maintaining a similar function to the conventional full-function EEPROM in which one memory cell includes one memory transistor and one selection transistor, memory capacity which is at least twice as large as conventional one in the same memory cell area can be realized. Accordingly, a full-function EEPROM in which integration density is improved, and thus reduction in size and cost can be realized can be provided.

It is needless to say that the above-described driving voltages are merely examples, and the present invention is not limited thereto. In practice, a voltage which is applied to a memory transistor depends on a first insulating film, a second insulating film, the capacity between a floating gate electrode and a gate electrode, the size of an overlap region, or the like of the memory transistor. Then, a driving voltage of the memory transistor changes depending on that.

It is necessary for the driving voltage to keep a potential difference needed for writing, reading, and erasing operations in a selected memory cell. Under such a condition, a stress (an unnecessary potential difference between terminals) which causes malfunction or decrease in reliability in a non-selected memory cell is preferably reduced as much as possible. The driving voltage may be any value in the range where malfunction or decrease in reliability does not matter for use.

Embodiment Mode 2

This embodiment mode describes a 2048-bit nonvolatile memory which includes p-channel transistors is described as an example of the nonvolatile memory of the present invention with reference to the drawing.

Figure 11:
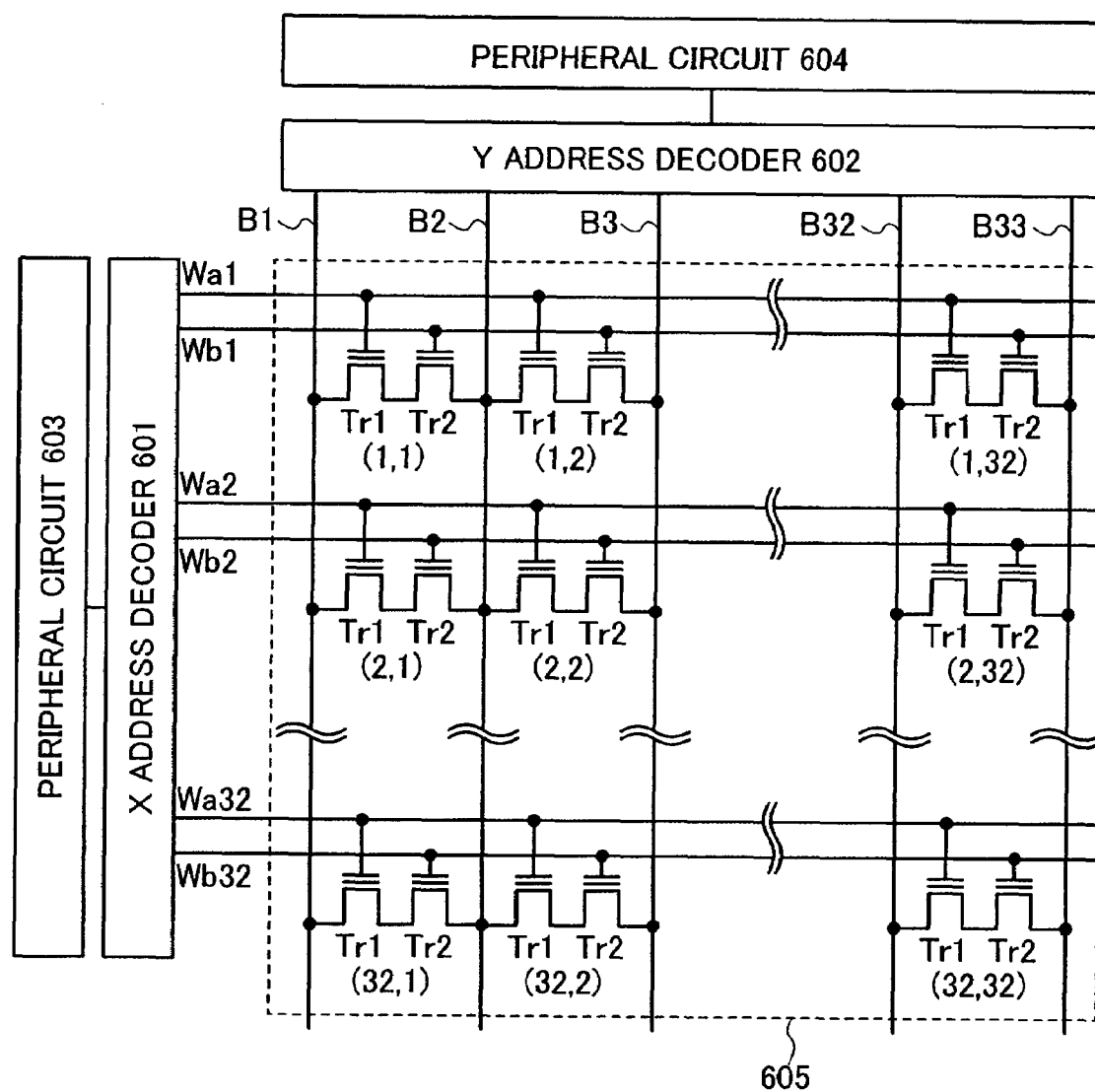
FIG. 11 shows one example of a nonvolatile memory of the present invention.
Figure 12:
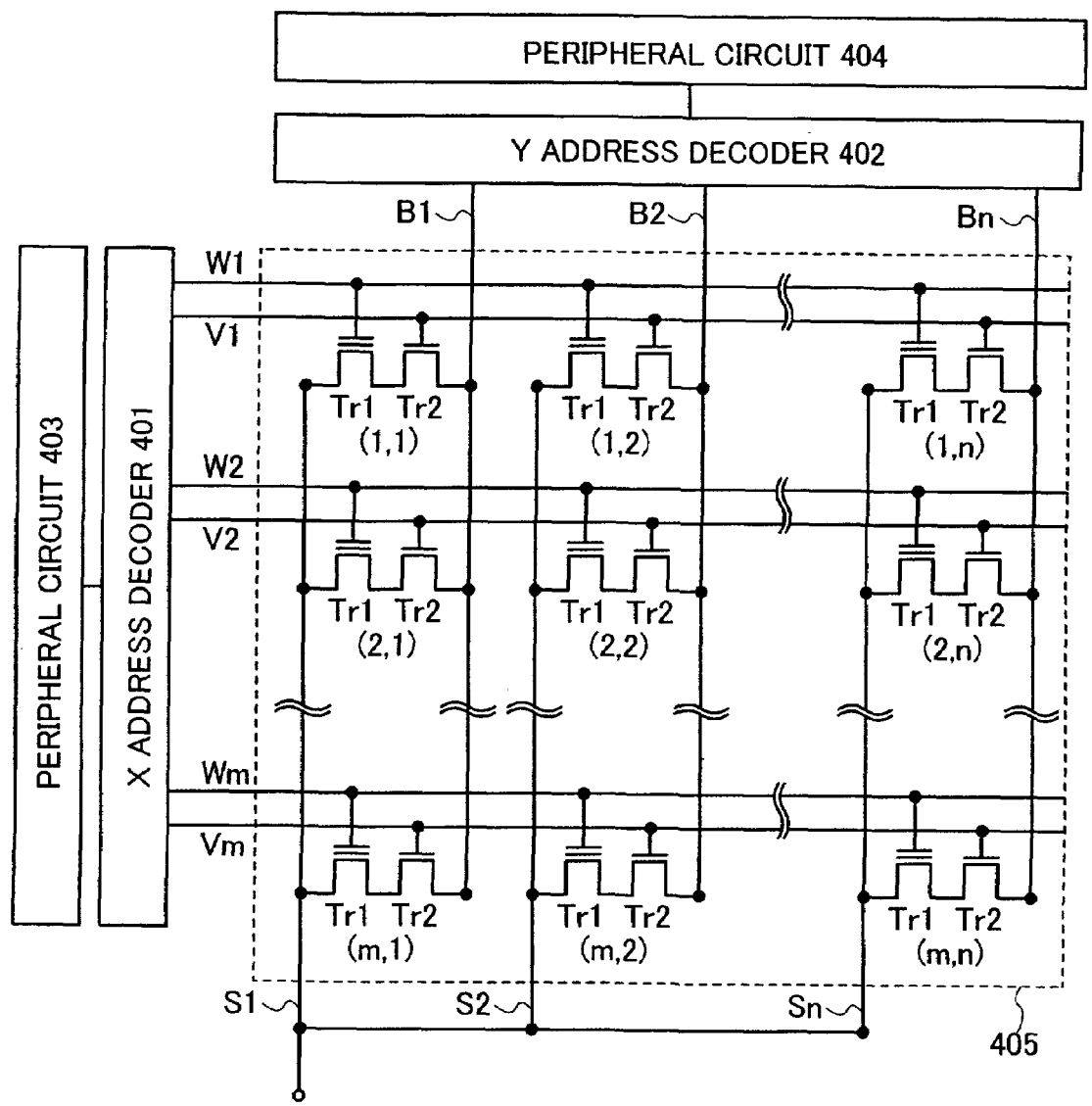
FIG. 12 shows one example of a conventional nonvolatile memory.

FIG. 11 is a circuit diagram of the nonvolatile memory of this embodiment mode. The nonvolatile memory shown in FIG. 11 includes a memory cell array 605 in which 1,024 memory cells (1, 1) to (32, 32) are arranged in matrix so as to be 32 memory cells in column and 32 memory cells in row, an X address decoder 601, a Y address decoder 602, and other peripheral circuits 603 and 604. Each memory cell includes two p-channel transistors Tr1 and Tr2. In the case where 1-bit data is stored in each memory transistor, the nonvolatile memory of this embodiment mode has a storage capacity of 2048 bits. The above-described other peripheral circuits include an address buffer circuit, a control logic circuit, a sense amplifier, a voltage step-up circuit, and the like, which are provided as needed.

Each memory cell (typically, a memory cell (i, j) is considered) (i and j are integers which are greater than or equal to 1 and less than or equal to 32) includes the two memory transistors Tr1 and Tr2. The two memory transistors Tr1 and Tr2 are connected in series. A control gate electrode and one of a source region and a drain region of the memory transistor Tr1 are connected to a first word line Wai and a bit line Bj respectively. A control gate electrode and the other of a source region and a drain region of the memory transistor Tr2 are connected to a second word line Wbi and a bit line B(j+1) respectively. Further, bit lines B1 to B32 are connected to the Y address decoder 602, and first word lines Wa1 to wa32 and second word lines Wb1 to Wb32 are connected to the X address decoder 601.

The nonvolatile memory described in this embodiment mode can store 2-bit data for each memory cell, and data writing, reading, and erasing can be performed completely in a unit of one bit. Operating methods thereof are similar to those of the n-channel nonvolatile memory described in Embodiment Mode 1, in which data writing and erasing are performed using tunneling current. Operating methods of the p-channel nonvolatile memory are described below briefly.

In the case where data is written into the memory transistor Tr1 in the memory cell (i, j), it is, for example, set as follows: the bit line Bj is at −10 V, the other bit lines Bk (k=1 to (j−1) and j+1) to 33) are at 0 V, the first word line Wai is at 10 V, the other first word lines Wak (k=1 to (i−1) and (i+1) to 32) are at 0 V, and all the second word lines Wbk (k=1 to 32) are at 0 V. In the memory transistor Tr1 in the memory cell (i, j), 10 V is applied to the control gate electrode and −10 V is applied to the source or drain region connected to the bit line Bj, so that tunneling current flows through an overlap region. Then, electrons are injected from the source or drain region to a floating gate electrode.

In the case where data is erased from the memory transistor Tr1 in the memory cell (i, j), it is, for example, set as follows: the bit line Bj is at +10 V, the other bit lines Bk (k=1 to (j−1) and (j+1) to 33) is at 0 V, the first word line Wai is at −10 V, the other first word lines Wak (k=1 to (i−1) and (i+1) to 32) are at 0 V, and all the second word lines Wbk (k=1 to 32) are at 10 V. Consequently, in the memory transistor Tr1 in the memory cell (i, j), −10 V is applied to the control gate electrode and 10 V is applied to the source or drain region connected to the bit line Bj, so that electrons are discharged by tunneling current from the floating gate electrode to a channel formation region.

Note that although there is a potential difference of 10 V between the bit line Bj and the other bit lines Bk (k=1 to (j−1) and (j+1) to 33), by setting all the second word lines Wbk (k=1 to 32) at 0 V (in writing data) or −10 V (in erasing data), each memory transistor Tr2 in all of the memory cells is turned off, so that little current flows between the bit lines. Further, respective potential differences which may occur in the other memory transistors other than the memory transistor Tr1 in the memory cell (i, j) are at most about 10 V, so that data writing into or data erasing from another memory transistor by mistake does not happen.

In the case where data is read from the memory transistor Tr1 in the memory cell (i, j), the bit line Bj is connected to a reading circuit, the bit line B(j+1) is set at 0 V, and the other bit lines Bk (k=1 to (j−1) and (j+2) to 33) are set in a floating state, for example. In addition, the first word line Wai in the i-th row is set at Vrl (V), the second word line Wbi in the i-th row is set at Vrh (V), the other first word lines Wak (k=1 to (i−1) and (i+1) to 32) are set at 0 V, and the other second word lines Wbk (k=1 to (i−1) and (i+1) to 32) are set at 0 V. Vrh (V) is selected so as to turn on a memory transistor regardless of whether data has been written or erased into/from the memory transistor (e.g., −6 V). Vrl (V) is selected so as to turn on a memory transistor in the state where data has been written into the memory transistor and turn off the memory transistor in the state where data has been erased from the memory transistor (e.g., −3 V). Consequently, both of the memory transistors Tr1 and Tr2 are turned on in the state where data has been written into the memory transistor Tr1, whereas the memory transistor Tr1 is turned off in the state where data has been erased from the memory transistor Tr1. That is, effective resistance of the memory cell (i, j) is largely changed. Therefore, by setting the bit line B(j+1) at 0 V and connecting the bit line Bj to the reading circuit, the state of the memory transistor Tr1 in the memory cell (i, j) can be read.

As described above, by employing a structure in which one memory cell includes two memory transistors and a source line is not included (instead of this, a bit line in a column which is adjacent to each memory transistor is connected), while maintaining a similar function to the conventional full-function EEPROM in which one memory cell includes one memory transistor and one selection transistor, memory capacity which is at least twice as large as conventional one in the same memory cell area can be realized. Accordingly, a full-function EEPROM in which integration density is improved, and thus reduction in size and cost can be realized can be provided.

Note that the reading circuit is not particularly limited as long as change in load resistance which is connected can be read. The reading circuit can perform resistive dividing, comparison of the charge amounts before and after precharge, or the like. In addition, all of the other bit lines Bk are in the floating state, thereby a reading operation is not affected.

It is needless to say that the above-described driving voltages are merely examples, and the present invention is not limited thereto. The driving voltage is any value as long as a potential difference needed for writing, reading, and erasing operations in a selected memory cell can be kept and in the range where malfunction is not caused in a non-selected memory cell.

This embodiment mode can be combined with another embodiment mode as needed in this specification.

Embodiment Mode 3

This embodiment mode describes one example of a manufacturing method of the nonvolatile memory of the present invention with reference to the drawings. Note that in the description below, as elements included in the nonvolatile memory, two memory transistors (n-channel memory TFTs) provided in a memory cell and two thin film transistors (a p-channel TFT and an n-channel TFT) included in a CMOS circuit which is a driver circuit of the memory cells or another peripheral circuit are described.

First, island-shaped semiconductor films 808, 810, and 812 are formed over a substrate 802 with an insulating film 804 interposed therebetween (FIG. 7A). The island-shaped semiconductor films 808, 810, and 812 can be provided as follows: an amorphous semiconductor film is formed of a material containing silicon (Si) as its main component (e.g., $Si_xGe_{1-x}$) by a sputtering method, an LPCVD method, a plasma CVD method, or the like over the insulating film 804 formed in advance over the substrate 802; the amorphous semiconductor film is crystallized; and then the crystallized semiconductor film is selectively etched. Note that the amorphous semiconductor film can be crystallized by a laser crystallization method, a thermal crystallization method using RTA or an annealing furnace, a thermal crystallization method using a metal element for promoting crystallization, a method in which some of these methods are combined, or the like.

When the crystallization or the recrystallization is performed by laser light irradiation, an LD-pumped continuous wave (CW) laser ($YVO_4$, the second harmonic (wavelength: 532 nm)) can be used as a laser light source. Although the wavelength is not necessarily limited to the second harmonic, the second harmonic is superior to other higher harmonics in point of energy efficiency. When a semiconductor film is irradiated with CW laser light, the semiconductor film continuously receives energy; therefore, once the semiconductor film is melted, the melted state can continue. Moreover, it is possible to move a solid-liquid interface of the semiconductor film by scanning CW laser light and to form crystal grains which are long in one direction along this moving direction. A solid-state laser is used because its output is so stable that a stable process can be expected as compared with a gas laser or the like. Not only a CW laser but also a pulsed laser with a repetition rate of 10 MHz or more can be used. In the case of using a pulsed laser with high repetition rate, if the pulse interval is shorter than the period after the semiconductor film is melted and before the melted semiconductor film is solidified, the semiconductor film can keep a melting state, whereby a semiconductor film including crystal grains which are long in one direction can be formed by moving a solid-liquid interface. Another CW laser or a pulsed laser with a repetition rate of 10 MHz or more can also be used. For example, as the gas laser, an Ar laser, a Kr laser, a $CO_2$ laser, or the like is given. As the solid-state laser, a YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like is given. As a metal vapor laser, a helium-cadmium laser or the like is given. Moreover, oscillation of laser light with $TEM_{00}$ (a single transverse mode) in a laser oscillator is preferable because the energy homogeneity of a linear beam spot on an irradiation surface can be raised. Further, a pulsed excimer laser may be used as well.

As the substrate 802, a glass substrate, a quartz substrate, a metal substrate (e.g., a stainless steel substrate), a ceramic substrate, or a semiconductor substrate such as a Si substrate can be used. Further, as a plastic substrate, a substrate comprising polyethylene terephthalate (PET), polyethylene naphthalate (PEN), polyether sulfone (PES), acrylic, or the like can be used as well.

The insulating film 804 is formed of an insulating material such as silicon oxide, silicon nitride, silicon oxynitride ($SiOxNy$, x>y>0), silicon nitride oxide ($SiNxOy$, x>y>0), or the like, by a CVD method, a spattering method, or the like. For example, in the case where the insulating film 804 employs a two-layer structure, a silicon nitride oxide film may be formed as the first insulating film and a silicon oxynitride film may be formed as the second insulating film. Alternatively, a silicon nitride film may be formed as the first insulating film and a silicon oxide film may be formed as the second insulating film. By forming the insulating film 804 which functions as a blocking layer in this manner, it is possible to prevent alkali metal such as Na or alkaline earth metal in the substrate 802 from adversely affecting an element to be formed over the insulating film 804. Note that in the case of using quartz as the substrate 802, the insulating film 804 may be omitted.

Further, in order to control a threshold value or the like, an impurity element may be introduced into the semiconductor films 808, 810, and 812 at a low concentration in advance. In this case, the impurity element is introduced also into a region which is to be a channel formation region in each of the semiconductor films 808, 810, and 812. As the impurity element, an impurity element which imparts n-type conductivity or an impurity element which imparts p-type conductivity can be used. As the impurity element which imparts n-type conductivity, phosphorus (P), arsenic (As), or the like can be used. As the impurity element which imparts p-type conductivity, boron (B), aluminum (Al), gallium (Ga), or the like can be used. For example, as the impurity element, boron (B) is introduced into the entire surface of each of the semiconductor films 808, 810, and 812 in advance so as to be contained at a concentration of in the range of $5 \times 10^{15}$ atoms/$cm^3$ to $5 \times 10^{17}$ atoms/$cm^3$.

Next, a resist 814 is formed so as to cover part of the semiconductor film 808, and the semiconductor films 810 and 812, and an impurity element is introduced into the semiconductor film 808 by using the resist 814 as a mask, so that impurity regions 816 are formed (FIG. 7B). As the impurity element, an impurity element which imparts n-type conductivity or an impurity element which imparts p-type conductivity can be used. As the impurity element which imparts n-type conductivity, phosphorus (P), arsenic (As), or the like can be used. As the impurity element which imparts p-type conductivity, boron (B), aluminum (Al), gallium (Ga), or the like can be used. Here, as the impurity element, phosphorus (P) is introduced into the other part of the semiconductor film 808 so as to be contained at a concentration of in the range of $1 \times 10^{19}$ atoms/$cm^3$ to $1 \times 10^{21}$ atoms/$cm^3$.

Next, oxidation treatment, nitridation treatment, or oxynitridation treatment is performed to the semiconductor films 808, 810, and 812 by high-density plasma treatment, thereby forming insulating films 818, 820, and 822 which are oxide films, nitride films, or oxynitride films on surfaces of the semiconductor films 808, 810, and 812 respectively. Subsequently, a charge accumulation layer 824 is formed so as to cover the insulating films 818, 820, and 822 (FIG. 7C).

For example, in the case where oxidation treatment or nitridation treatment is performed to the semiconductor films 808, 810, and 812 comprising silicon as their main component, a silicon oxide (SiOx) film or a silicon nitride (SiNx) film is formed as each of the insulating films 818, 820, and 822. Further, after performing oxidation treatment to the semiconductor films 808, 810, and 812 by high-density plasma treatment, nitridation treatment may be performed by high-density plasma treatment again. In this case, a silicon oxide film is formed in contact with each of the semiconductor films 808, 810, and 812 and a film including oxygen and nitrogen (hereinafter referred to as an 'oxynitride film') is formed over the silicon oxide film, thereby a stacked layer of the silicon oxide film and the oxynitride film is formed as each of the insulating films 818, 820, and 822.

Here, each of the insulating films 818, 820, and 822 is formed to a thickness of 1 to 10 nm, preferably 1 to 5 nm. For example, after forming a silicon oxide film to a thickness of about 5 nm on each surface of the semiconductor films 808, 810, and 812 by performing oxidation treatment to the semiconductor films 808, 810, and 812 with high-density plasma treatment, an oxynitride film to a thickness of about 2 nm is formed on each surface of the silicon oxide films with high-density plasma treatment. In this case, the oxidation treatment and the nitridation treatment with high-density plasma treatment are preferably performed continuously without exposure to the air. By continuously performing high-density plasma treatment, prevention of impurity incorporation and improvement of production efficiency can be achieved.

Note that in the case of oxidizing the semiconductor films with high-density plasma treatment, the plasma treatment is performed under an oxygen atmosphere (e.g., an atmosphere including either oxygen ($O_2$) or dinitrogen monoxide ($N_2O$) and a rare gas (including at least one of He, Ne, Ar, Kr, and Xe); or an atmosphere including either oxygen or dinitrogen monoxide, hydrogen ($H_2$), and a rare gas). On the other hand, in the case of nitriding the semiconductor films with high-density plasma treatment, the treatment is performed under a nitrogen atmosphere (e.g., an atmosphere including nitrogen ($N_2$) and a rare gas (including at least one of He, Ne, Ar, Kr, and Xe); an atmosphere including nitrogen, hydrogen, and a rare gas; or an atmosphere including $NH_3$ and a rare gas).

As the rare gas, for example, Ar can be used. Alternatively, a gas in which Ar and Kr are mixed may be used. In the case where the high-density plasma treatment is performed in a rare gas atmosphere, the insulating films 818, 820, and 822 may include the rare gas (including at least one of He, Ne, Ar, Kr, and Xe) used for the plasma treatment. When Ar is used, the insulating films 818, 820, and 822 may include Ar.

Further, the high-density plasma treatment is performed in an atmosphere including the above-described gas with an electron density of $1 \times 10^{11}$ $cm^{-3}$ or more and plasma electron temperature of 1.5 eV or less. More specifically, the electron density is equal to or higher than $1\times10^{11}$ cm$^{-3}$ and equal to or lower than $1\times10^{13}$ cm$^{-3}$ and the plasma electron temperature is equal to or higher than 0.5 eV and equal to or lower than 1.5 eV. Since the plasma electron density is high and the electron temperature in the vicinity of an object to be processed, formed over the substrate 802 (here, the semiconductor films 808, 810, and 812) is low, plasma damage on the object to be processed can be prevented. Moreover, since the plasma electron density is high which is $1\times10^{11}$ cm$^{-3}$ or more, an oxide film or a nitride film formed by oxidizing or nitriding the object to be processed, with the plasma treatment can be dense and superior in uniformity of its film thickness and the like as compared with a film formed by a CVD method, a sputtering method, or the like. Furthermore, since the plasma electron temperature is low which is 1.5 eV or less, the oxidation or nitridation treatment can be performed at lower temperature than conventional plasma treatment or thermal oxidation method. For example, even plasma treatment at a temperature lower than the distortion point of a glass substrate by 100° C. or more can sufficiently perform oxidation or nitridation treatment. As the frequency for forming plasma, high frequency such as a microwave (e.g., 2.45 GHz) can be used.

In this embodiment mode, the insulating film 818 formed over the semiconductor film 808 in a memory portion functions as a tunnel oxide film in a nonvolatile memory completed later. Therefore, the thinner the insulating film 818 is, the more easily the tunneling current flows, which allows a high-speed operation as a memory. Further, as the thickness of the insulating film 818 is decreased, charges can be accumulated at lower voltage in a charge accumulation layer formed later; therefore, power consumption of a semiconductor device can be reduced. Accordingly, the insulating film 818 is preferably formed to be thin.

In general, a thermal oxidation method is given as an example of a method for forming a thin insulating film over a semiconductor film. However, when a memory element is provided over a substrate of which melting point is not sufficiently high, such as a glass substrate, it is very difficult to form the insulating films 818, 820, and 822 by a thermal oxidation method. Further, an insulating film formed by a CVD method or a sputtering method does not have enough film quality because of a defect inside the film, causing a defect such as a pinhole when the film is formed to be thin. In addition, an insulating film formed by a CVD method or a sputtering method does not cover an end portion of the semiconductor film sufficiently, resulting in that a conductive film and the like to be later formed over each of the insulating films 818, 820, and 822 and each semiconductor film may be in contact with each other to cause leakage. Thus, by forming the insulating films 818, 820, and 822 with the high-density plasma treatment as described in this embodiment mode, the insulating films 818, 820, and 822 can be denser than an insulating film formed by a CVD method, a sputtering method, or the like, and can cover end portions of the semiconductor films sufficiently. As a result, the operation speed as a memory can be increased and the power consumption of a semiconductor device can be reduced.

Further, the insulating films 818, 820, and 822 may also be formed of silicon oxide, silicon nitride, silicon oxynitride (SiOxNy, x>y>0), silicon nitride oxide (SiNxOy, x>y>0), or the like, by a CVD method or a spattering method over the semiconductor films 808, 810, and 812. Further, it is preferable to perform oxidation treatment, nitridation treatment, or oxynitridation treatment to the insulating films with high-density plasma treatment after the insulating films are formed of such a material. This is because surfaces of the insulating films can be dense by performing oxidation treatment, nitridation treatment, or oxynitridation treatment to the insulating films.

The charge accumulation layer 824 functions as a layer for accumulating charges in a memory element completed later and may also be called a floating gate in general.

The charge accumulation layer 824 is preferably formed of a material with a smaller energy gap (band gap) than the material used for the semiconductor films 808, 810, and 812 (e.g., silicon: Si). For example, the charge accumulation layer 824 can be formed of germanium (Ge), a silicon-germanium alloy, or the like. Further, any other conductive film or semiconductor film can also be used as the charge accumulation layer 824 as long as the energy gap (band gap) is smaller than that of the material used for the semiconductor films 808, 810, and 812.

For example, as the charge accumulation layer 824, a film containing germanium as its main component is formed to a thickness of 1 to 20 nm, preferably 5 to 10 nm, in an atmosphere including a germanium element (e.g., GeH$_4$) by a plasma CVD method. In this manner, in the case where each semiconductor film is formed of a material containing Si as its main component and a film including germanium with a smaller energy gap than Si is provided as a charge accumulation layer over the semiconductor film with an insulating film which functions as a tunnel oxide film interposed therebetween, a second barrier formed by the insulating film against charges of the charge accumulation layer gets higher in energy than a first barrier formed by the insulating film against charges of the semiconductor film. As a result, charges can be easily injected from the semiconductor film to the charge accumulation layer, and charges are prevented from disappearing from the charge accumulation layer. That is, in the case of operating as a memory, highly-efficient writing with a low voltage can be performed and the charge holding characteristics can be improved.

Further, as the charge accumulation layer 824, an insulating layer having a defect for trapping a charge, or an insulating layer including conductive particles or semiconductor particles of silicon or the like can be formed as well. For example, the charge accumulation layer 824 is formed of an insulating layer containing a nitrogen element, such as a silicon nitride (SiNx) film, a silicon nitride oxide (SiNxOy, x>y>0) film, or a silicon oxynitride (SiOxNy, x>y>0) film, or a film in which conductive particles or semiconductor particles are included in such an insulating layer.

Next, part of the charge accumulation layer 824 and the insulating films 820 and 822 which are formed over the semiconductor films 810 and 812 are selectively removed, so that surfaces of the semiconductor films 810 and 812 are exposed. At this time, a charge accumulation layer 826 which is left over the semiconductor film 808 is formed (FIG. 7D).

Next, an insulating film 828 is formed so as to cover the charge accumulation layer 826, and the semiconductor films 810 and 812 (FIG. 8A).

The insulating film 828 can be formed of an insulating film such as a silicon oxide (SiOx) film, a silicon oxynitride (SiOxNy, x>y) film, a silicon nitride (SiNx) film, a silicon nitride oxide (SiNxOy, x>y) film, or the like. Such an insulating film can be formed by a CVD method, a sputtering method, or the like. Further, after such an insulating film is formed by a CVD method, oxidation treatment, nitridation treatment, or oxynitridation treatment may be performed to the insulating film by performing high-density plasma treatment. Further, for the insulating film 828, a material such as aluminum oxide (AlOx), hafnium oxide (HfOx), tantalum oxide (TaOx), or the like can also be used.

Next, part of the insulating film 828, which is formed over the semiconductor films 810 and 812 is selectively removed, so that the surfaces of the semiconductor films 810 and 812 are exposed (FIG. 8B).

Next, by performing high-density plasma treatment, insulating films 832 and 834 are formed over the semiconductor films 810 and 812 respectively (FIG. 8C). At this time, an insulating film 830 which is left over the semiconductor film 808 is formed. For example, by performing high-density plasma treatment under an oxygen atmosphere, the insulating films 832 and 834 each including a silicon oxide film are formed on the surfaces of the semiconductor films 810 and 812 respectively. Note that the insulating films 832 and 834 function as gate insulating films in thin film transistors completed later.

Alternatively, the part of the insulating film 828, which is formed over the semiconductor films 810 and 812, is not removed, and can be used as the gate insulating films. In this case, it is preferable to make a surface of the insulating film 828 dense by performing high-density plasma treatment after the insulating film 828 is formed. In this way, a manufacturing process can be simplified.

Next, a conductive film 836 is formed so as to cover the insulating film 830, and the insulating films 832 and 834 (FIG. 8D).

The conductive film 836 can be formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing the element as its component. Further, it can also be formed of a semiconductor material typified by polycrystalline silicon doped with an impurity element such as phosphorus. Here, the conductive film 836 is provided by stacking tantalum nitride and tungsten in this order. Further, in the case of employing a stacked-layer structure as the conductive film 836, it can be provided by forming tungsten nitride, molybdenum nitride, or titanium nitride as the lower layer and forming tantalum, molybdenum, titanium, or the like as the upper layer.

Next, a resist is selectively provided over the conductive film 836, and using the resist as a mask, the insulating film 818, the charge accumulation layer 826, the insulating film 830, and the conductive film 836 provided over the semiconductor film 808 are selectively removed. At the same time, the insulating film 832 and the conductive film 836 provided over the semiconductor film 810, and the insulating film 834 and the conductive film 836 provided over the semiconductor film 812 are selectively removed. Accordingly, over the semiconductor film 808, a stacked layer in which an insulating film 838, a charge accumulation layer 840, an insulting film 842, and a conductive film 844 are stacked in this order (hereinafter also referred to as a "stacked-layer structure 1") and a stacked layer in which an insulating film 848, a charge accumulation layer 850, an insulting film 852, and a conductive film 854 are stacked in this order (hereinafter also referred to as a "stacked-layer structure 2") are formed. Further, a stacked layer in which an insulating film 858 and a conductive film 860 are stacked in this order is formed over the semiconductor film 810, and a stacked layer in which an insulating film 862 and a conductive film 864 are stacked in this order is formed over the semiconductor film 812 (FIG. 9A).

Further, here, selective etching is performed such that a region 846 (an overlap region) where an end portion of the stacked-layer structure 1 and part of the impurity region 816 are overlapped with each other and a region 856 (an overlap region) where an end portion of the stacked-layer structure 2 and part of the impurity region 816 are overlapped with each other are formed in the semiconductor film 808, to form the stacked-layer structures 1 and 2.

Further, the insulating films 838 and 848 formed above the semiconductor film 808 function as tunnel insulating films in a memory, and the insulating films 842 and 852 function as control insulating films in the memory.

Next, an impurity element is introduced into the semiconductor films 808, 810, and 812 by using the conductive films 844, 854, 860, and 864 as masks, so that low-concentration impurity regions 868, 870, and 872 are formed (FIG. 9B). As the impurity element, an impurity element which imparts n-type conductivity or an impurity element which imparts p-type conductivity can be used. As the impurity element which imparts n-type conductivity, phosphorus (P), arsenic (As), or the like can be used. As the impurity element which imparts p-type conductivity, boron (B), aluminum (Al), gallium (Ga), or the like can be used. Here, phosphorus (P) is introduced at a concentration of in the range of $1\times10^{15}$ atoms/cm$^3$ to $1\times10^{19}$ atoms/cm$^3$, thereby forming the low-concentration impurity regions 868, 870, and 872 having n-type conductivity.

Next, a resist 874 is selectively formed so as to cover the semiconductor films 808 and 812 and an impurity element is introduced into the semiconductor film 810 by using the conductive film 860 as a mask, so that high-concentration impurity regions 876 are formed (FIG. 9C). The high-concentration impurity regions 876 function as source and drain regions in a thin film transistor, and a channel formation region 878 is formed between the high-concentration impurity regions 876 which are provided with a space interposed therebetween. As the impurity element, an impurity element which imparts n-type conductivity or an impurity element which imparts p-type conductivity can be used. As the impurity element which imparts n-type conductivity, phosphorus (P), arsenic (As), or the like can be used. As the impurity element which imparts p-type conductivity, boron (B), aluminum (Al), gallium (Ga), or the like can be used. Here, boron (B) is introduced at a concentration of in the range of $1\times10^{19}$ atoms/cm$^3$ to $1\times10^{21}$ atoms/cm$^3$, thereby forming the high-concentration impurity regions 876 having p-type conductivity.

Next, insulating films 880 (also called sidewalls) are formed to be in contact with side surfaces of the conductive films 844, 854, 860, and 864 (FIG. 9D). Specifically, by a plasma CVD method, a sputtering method, or the like, either a single layer or a stacked layer of a film containing an inorganic material such as silicon, silicon oxide, silicon nitride, or the like is formed. Then, the insulating film is selectively etched by anisotropic etching in a perpendicular direction, so that the insulating films can be formed so as to be in contact with the side surfaces of the conductive films 844, 854, 860, and 864. Note that each insulating film 880 is used as a mask for doping when an LDD (Lightly Doped Drain) region is formed.

Figure 10A:
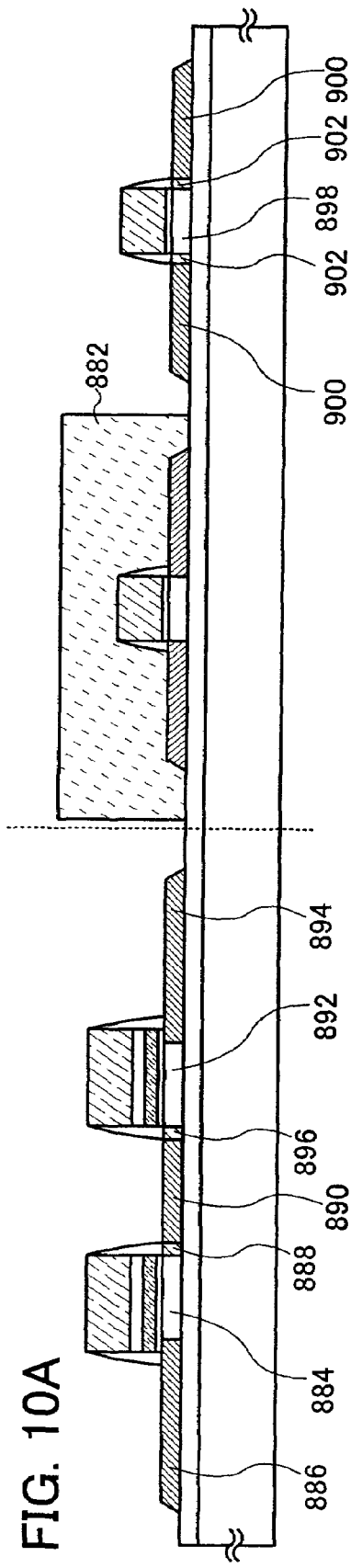
FIGS. 10A and 10B show one example of a manufacturing method of a nonvolatile memory of the present invention.

Next, a resist 882 is selectively formed so as to cover the semiconductor film 810, and an impurity element is introduced into the semiconductor films 808 and 812 by using the conductive films 844, 854, and 864 and the insulating films 880 as masks, so that high-concentration impurity regions 886, 890, 894, and 900 are formed (FIG. 10A). Note that parts of the high-concentration impurity regions 886 and 894 are formed by introducing the impurity element again into the impurity regions 816 which are formed in advance.

Each of the high-concentration impurity regions 886, 890, 894, and 900 functions as a source or drain region. Low-concentration impurity regions 888 and 896 (LDD regions) are formed in regions which are adjacent to the high-concentration impurity region 890 and below the insulating films 880. Further, low-concentration impurity regions 902 (LDD regions) are formed in regions which are adjacent to the high-concentration impurity regions 900 and below the insulating films 880, and a channel formation region 898 is formed between the low-concentration impurity regions 902. Further, a channel formation region 884 is formed between the high-concentration impurity region 886 and the low-concentration impurity region 888, and a channel formation region 892 is formed between the high-concentration impurity region 894 and the low-concentration impurity region 896. As the impurity element, an impurity element which imparts n-type conductivity or an impurity element which imparts p-type conductivity can be used. As the impurity element which imparts n-type conductivity, phosphorus (P), arsenic (As), or the like can be used. As the impurity element which imparts p-type conductivity, boron (B), aluminum (Al), gallium (Ga), or the like can be used. Here, phosphorus (P) is introduced at a concentration of in the range of $1 \times 10^{19}$ atoms/cm$^3$ to $1 \times 10^{21}$ atoms/cm$^3$, thereby forming the high-concentration impurity regions 886, 890, and 894 having n-type conductivity.

Figure 10B:
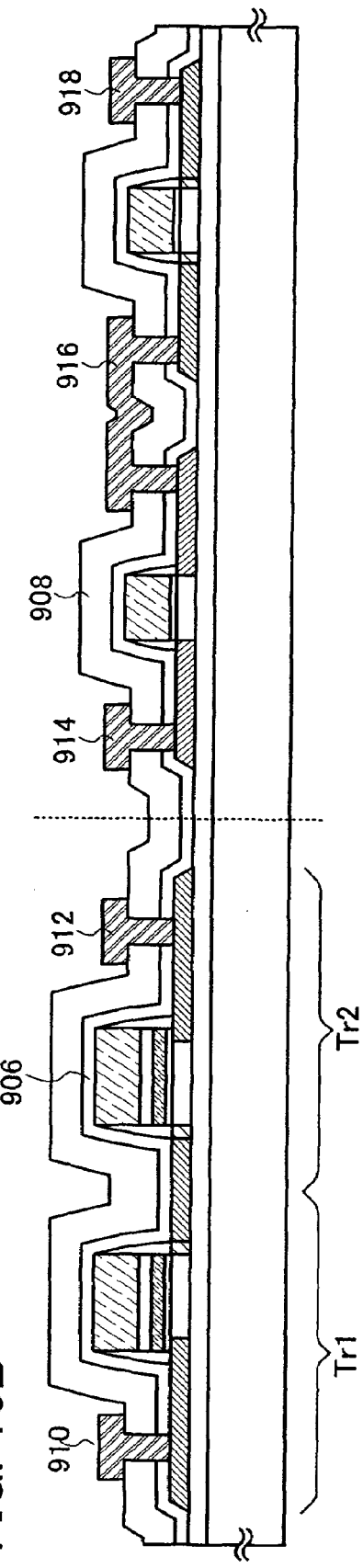

Next, an insulating film is formed over the semiconductor films 808, 810, and 812 and the conductive films 844, 854, 860, and 864 (FIG. 10B). Described here is an example in which the insulating film is formed by stacking an insulating film 906 and an insulating film 908. The insulating film may also employ a single-layer structure or a stacked-layer structure including three or more layers. After that, contact holes are selectively formed in the insulating films 906 and 908, and conductive films 910, 912, 914, 916, and 918, which are electrically connected to the source and drain regions of the semiconductor films 808, 810, and 812, are selectively formed.

Each of the insulating films 906 and 908 can be provided by employing a single-layer structure or a stacked-layer structure of an insulating layer containing oxygen or nitrogen such as silicon oxide (SiOx), silicon nitride (SiNx), silicon oxynitride (SiOxNy) (x>y), or silicon nitride oxide (SiNxOy) (x>y); a film containing carbon such as DLC (diamond-like carbon); an organic material such as epoxy, polyimide, polyamide, polyvinyl phenol, benzocyclobutene, or acrylic; or a siloxane material such as siloxane, with a CVD method, a sputtering method, or the like. The siloxane material is a material having a Si—O—Si bond. Siloxane has a skeleton structure formed of a bond of silicon (Si) and oxygen (O). As a substituent, an organic group containing at least hydrogen (e.g., an alkyl group or aromatic hydrocarbon) is used. Alternatively, a fluoro group may be used as a substituent. Further alternatively, as a substituent, both a fluoro group and an organic group containing at least hydrogen may be used.

Each of the conductive films 910, 912, 914, 916, and 918 is formed of a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component by a CVD method, a sputtering method, or the like. An alloy material containing aluminum as its main component corresponds to, for example, an alloy material containing aluminum as its main component and nickel, or an alloy material containing aluminum as its main component, nickel and one or both of carbon and silicon. It is preferable to employ, for example, a stacked-layer structure of a barrier film, an aluminum-silicon (Al—Si) film, and a barrier film, or a stacked-layer structure of a barrier film, an aluminum-silicon (Al—Si) film, a titanium nitride (TiN) film, and a barrier film. Note that the barrier film corresponds to a thin film formed of titanium, nitride of titanium, molybdenum, or nitride of molybdenum. Aluminum and aluminum silicon are optimal materials for forming the conductive films 910, 912, 914, 916, and 918 because they are low in resistance and inexpensive. Further, generation of hillocks of aluminum or aluminum silicon can be prevented when upper and lower barrier layers are provided. Further, when the barrier film is formed of titanium that is a highly reducible element, a thin natural oxide film, which may be formed on each crystalline semiconductor layer, is reduced so that preferable contact with each crystalline semiconductor layer can be obtained.

Through the above-described steps, memory transistors Tr1 and Tr2 (n-channel memory TFTs) and two thin film transistors (p-channel and n-channel TFTs) included in a CMOS circuit which is a driver circuit of memory cells or another peripheral circuit can be manufactured.

Further, by employing the structure described in this embodiment mode in which one memory cell includes two memory transistors and a source line is not included (instead of this, a bit line in a column which is adjacent to each memory transistor is connected), while maintaining a similar function to the conventional full-function EEPROM in which one memory cell includes one memory transistor and one selection transistor, memory capacity which is at least twice as large as conventional one in the same memory cell area can be realized. Accordingly, a full-function EEPROM in which integration density is improved, and thus reduction in size and cost can be realized can be formed.

Note that although this embodiment mode describes the example of forming a thin film transistor (TFT) by using a semiconductor film formed over a substrate, the semiconductor device of the present invention is not limited to this. For example, a field effect transistor (FET) in which a channel formation region is formed directly in a semiconductor substrate comprising Si or the like may be used as well.

This embodiment mode can be combined with another embodiment modes as needed in this specification.

Embodiment Mode 4

This embodiment mode describes an application example of a semiconductor device provided with the nonvolatile semiconductor memory described in any of the above-described embodiment modes, which is capable of data input and data output wirelessly with reference to the drawing. The semiconductor device which is capable of data input and data output wirelessly is also called an RFID tag, an ID tag, an IC tag, an IC chip, an RF tag, a wireless tag, an electronic tag, or a wireless chip depending on its usage mode.

First, an example of a top-surface structure of a semiconductor device described in this embodiment mode is described with reference to FIG. 13A. A semiconductor device 80 shown in FIG. 13A includes a thin film integrated circuit 131 in which a plurality of elements included in the nonvolatile memory described in any of the above-described embodiment modes and a logic portion and a conductive film 132 which functions as an antenna. The conductive film 132 which functions as an antenna is electrically connected to the thin film integrated circuit 131.

Figure 13A:
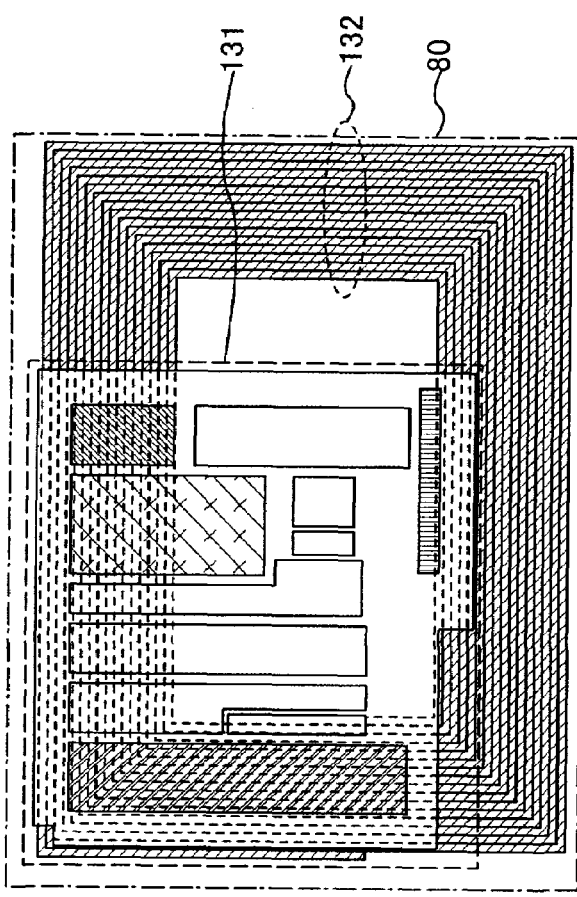
FIGS. 13A and 13B show one example of a semiconductor device of the present invention.
Figure 13B:
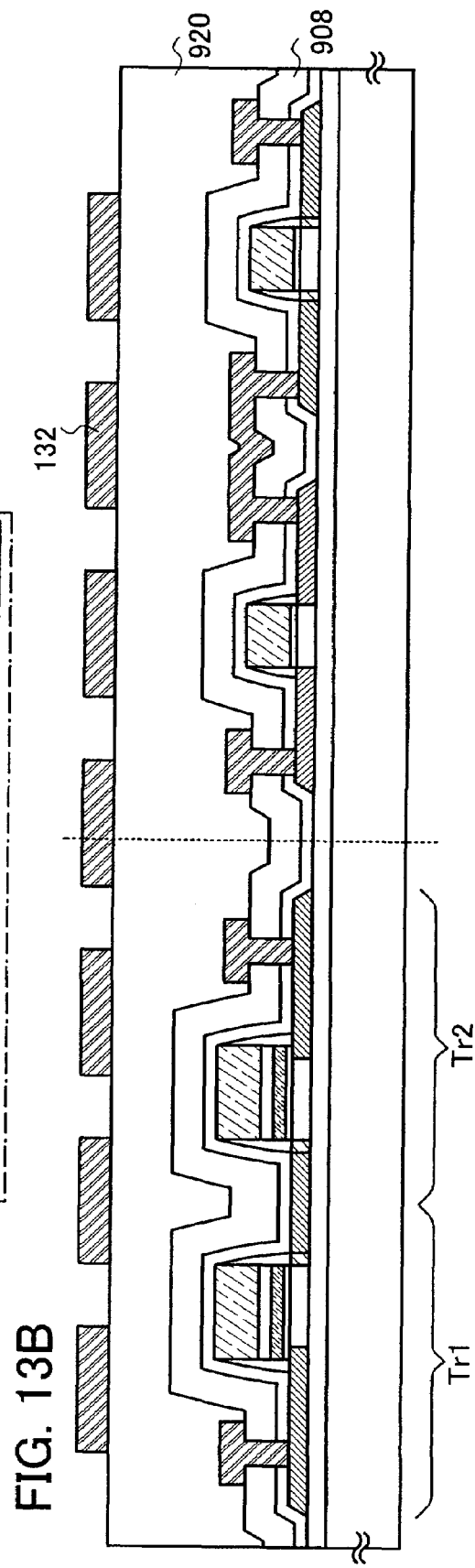

FIG. 13B is a schematic view of a cross section of FIG. 13A. The conductive film 132 which functions as an antenna may be provided above the elements included in the memory portion and the logic portion. For example, in the structure described in the above embodiment mode, a conductive film 132 which functions as an antenna can be provided over the insulating film 908 with an insulating film 920 interposed therebetween.

Further, the conductive film 132 which functions as the antenna may overlap the thin film integrated circuit 131 or may be provided in the periphery so as not to overlap the thin film integrated circuit 131. Further, this embodiment mode describes an example in which the conductive film 132 which functions as the antenna is provided in the shape of a coil and an electromagnetic induction method or an electromagnetic coupling method is employed; however, the semiconductor device of the present invention is not limited to this, and a microwave method may also be employed. In the case of a microwave method, the shape of the conductive film 132 which functions as the antenna may be decided as appropriate depending on the wavelength of an electromagnetic wave used.

For example, when the electromagnetic coupling method or the electromagnetic induction method (e.g., with a frequency band of 13.56 MHz) is employed as the signal transmission method of the semiconductor device, because electromagnetic induction by change in the magnetic field density is used, the conductive film which functions as an antenna is formed in the shape of a ring (e.g., a loop antenna) or in the shape of a spiral (e.g., a spiral antenna).

Further, when the microwave method (e.g., with an UHF band (in the range of 860 MHz to 960 MHz), a frequency band of 2.45 GHz, or the like) is employed as the signal transmission method of the semiconductor device, the shape such as the length or the like of the conductive film which functions as the antenna may be set as appropriate in consideration of the wavelength of an electromagnetic wave used in sending a signal. For example, the conductive film which functions as the antenna can be formed in the shape of a line (e.g., a dipole antenna), in the flat shape (e.g., a patch antenna), in the shape of a ribbon, or the like. Further, the shape of the conductive film which functions as the antenna is not limited to a line, and the conductive film which functions as the antenna in the shape of a curved line or in an S-shape may also be provided in consideration of the wavelength of the electromagnetic wave.

The conductive film 132 which functions as the antenna is formed of a conductive material by a CVD method, a sputtering method, a printing method such as a screen printing method, a gravure printing method, or the like, a droplet discharge method, a dispenser method, a plating method, or the like. The conductive material is formed of a single layer or a stacked layer of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material including the element as its main component.

Further, when the antenna is provided, the thin film integrated circuit 131 and the conductive film 132 which functions as the antenna may be directly formed over one substrate; or after the thin film integrated circuit 131 and the conductive film 132 which functions as the antenna may formed over separate substrates, they may be attached to each other so as to electrically connect each other.

Next, one example of an operation of the semiconductor device described in this embodiment mode is described.

Figure 14A:
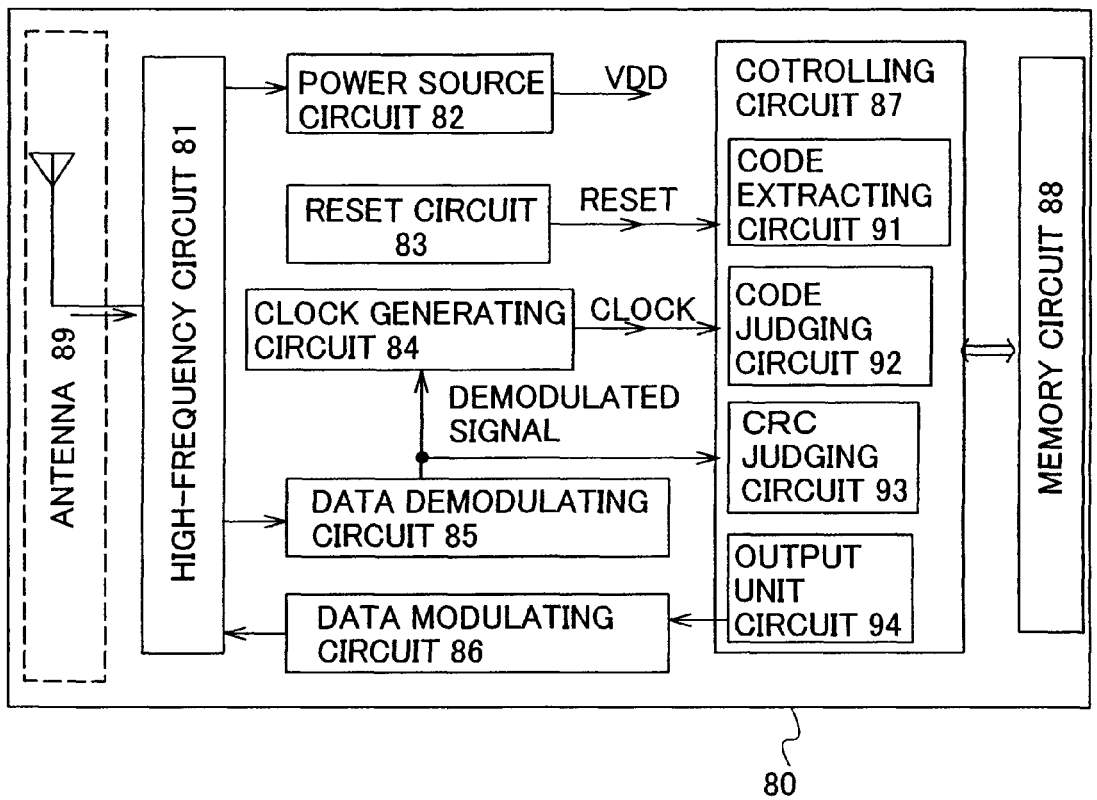
FIGS. 14A to 14C show examples of a usage pattern of a semiconductor device of the present invention.

The semiconductor device 80 has a function of exchanging data wirelessly, and includes a high-frequency circuit 81, a power source circuit 82, a reset circuit 83, a clock generating circuit 84, a data demodulating circuit 85, a data modulating circuit 86, a controlling circuit 87 for controlling another circuit, a memory circuit 88, and an antenna 89 (FIG. 14A). The high-frequency circuit 81 receives a signal from the antenna 89 and then outputs a signal, which is received from the data modulating circuit 86, through the antenna 89. The power source circuit 82 generates a power source potential from a received signal. The reset circuit 83 generates a reset signal. The clock generating circuit 84 generates various clock signals based on a received signal inputted from the antenna 89. The data demodulating circuit 85 demodulates a received signal and outputs to the controlling circuit 87. The data modulating circuit 86 modulates a signal received from the controlling circuit 87. As the controlling circuit 87, for example, a code extracting circuit 91, a code judging circuit 92, a CRC judging circuit 93, and an output unit circuit 94 are provided. Note that the code extracting circuit 91 extracts each of a plurality of codes included in an instruction sent to the controlling circuit 87. The code judging circuit 92 judges the content of the instruction by comparing each extracted code with a code corresponding to a reference. The CRC judging circuit 93 detects whether or not there is a transmission error or the like based on a judged code.

Next, one example of an operation of the aforementioned semiconductor device is described. First, a wireless signal is received by the antenna 89 and then sent to the power source circuit 82 through the high-frequency circuit 81, thereby generating a high power source potential (hereinafter referred to as VDD). VDD is supplied to each circuit in the semiconductor device 80. A signal sent to the data demodulating circuit 85 through the high-frequency circuit 81 is demodulated (hereinafter this signal is called a demodulated signal). Moreover, signals passed through the reset circuit 83 and the clock generating circuit 84 from the high-frequency circuit 81, and the demodulated signal are sent to the controlling circuit 87. The signals sent to the controlling circuit 87 are analyzed by the code extracting circuit 91, the code judging circuit 92, the CRC judging circuit 93, and the like. Then, based on the analyzed signals, information of the semiconductor device stored in the memory circuit 88 is outputted. The outputted information of the semiconductor device is encoded through the output unit circuit 94. Further, the encoded information of the semiconductor device 80 passes through the data modulating circuit 86 and then is sent by the antenna 89 while being superimposed on a wireless signal. Note that a low power source potential (hereinafter called VSS) is common in the plurality of circuits included in the semiconductor device 80 and GND can be used as VSS. Further, the nonvolatile memory of the present invention can be applied to the memory circuit 88.

In this manner, a signal is sent from a reader/writer to the semiconductor device 80 and a signal sent from the semiconductor device 80 is received by the reader/writer, so that data of the semiconductor device can be read.

Further, in the semiconductor device 80, power source voltage may be supplied to each circuit by electromagnetic waves without providing a power supply (a battery), or a power supply (a battery) may be provided so that power supply voltage is supplied to each circuit by both electromagnetic waves and the power supply (the battery).

Figure 14B:
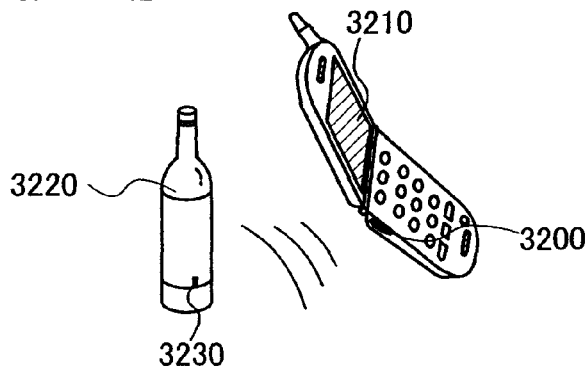
Figure 14C:
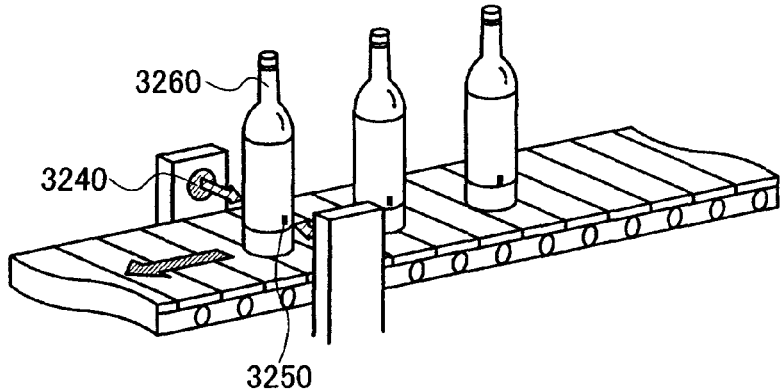

Next, one example of usage of a semiconductor device which is capable of data input and data output wirelessly is described. A side surface of a mobile terminal including a display portion 3210 is provided with a reader/writer 3200, and a side surface of a product 3220 is provided with a semiconductor device 3230 (FIG. 14B). When the reader/writer 3200 is held over the semiconductor device 3230 included in the product 3220, the display portion 3210 displays information on the product, such as a material, a production area, an inspection result for each production step, a history of distribution process, description of the product, or the like. Further, when a product 3260 is transferred by a conveyer belt, the product 3260 can be inspected by using a reader/writer 3240 and a semiconductor device 3250 provided for the product 3260 (FIG. 14C). In this manner, by using the semiconductor device in the system, information can be obtained easily and high performance and a high added value are achieved.

Further, the nonvolatile memory of the present invention can be used for electronic appliances equipped with a memory of various fields. For example, as electronic appliances to which the nonvolatile memory of the present invention is applied, the following can be given: a camera such as a video camera or a digital camera, a goggle type display (a head-mounted display), a navigation system, an audio reproducing device (e.g., a car audio set or an audio component set), a computer, a game machine, a portable information terminal (e.g., a mobile computer, a mobile phone, a portable game machine, or an electronic book), and an image reproducing device provided with a recording medium (specifically, a device provided with a display that can reproduce a recording medium such as a digital versatile disk (DVD) and display the image), and the like. Specific examples of these electronic appliances are shown in FIGS. 15A to 15E.

Figure 15A:
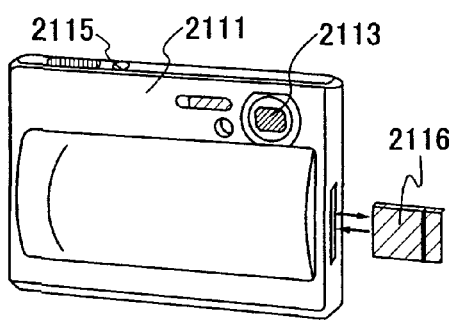
FIGS. 15A to 15E show examples of a usage pattern of a semiconductor device of the present invention.
Figure 15B:
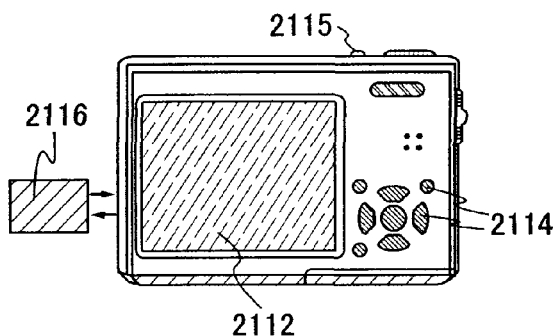

FIGS. 15A and 15B show a digital camera. FIG. 15B is a view showing the back of the digital camera shown in FIG. 15A. The digital camera includes a chassis 2111, a display portion 2112, a lens 2113, operation keys 2114, a shutter button 2115, and the like. The digital camera is provided with a removable nonvolatile memory 2116 in which data taken by the digital camera is stored. The nonvolatile memory formed using the present invention can be applied to the memory 2116.

Figure 15C:
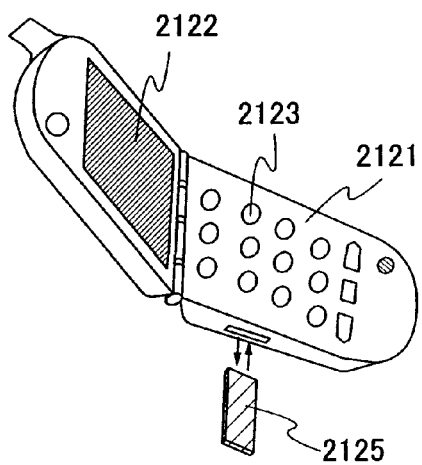

FIG. 15C shows a mobile phone, which is a typical example of a mobile terminal. The mobile phone includes a chassis 2121, a display portion 2122, operation keys 2123, and the like. The mobile phone is provided with a removable nonvolatile memory 2125. Data such as a phone number of the mobile phone, image data, music data, or the like can be stored in the memory 2125 and can be reproduced. The nonvolatile memory formed using the present invention can be applied to the memory 2125.

Figure 15D:
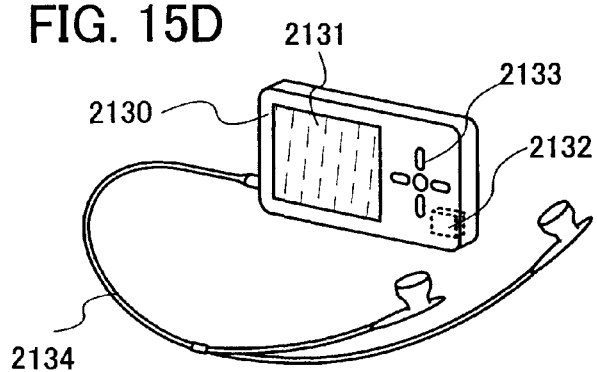

FIG. 15D shows a digital player, which is a typical example of an audio device. The digital player shown in FIG. 15D includes a main body 2130, a display portion 2131, a memory portion 2132, an operation portion 2133, earphones 2134, and the like. Further, headphones or wireless earphones can be used instead of the earphone 2134. The nonvolatile memory formed using the present invention can be used for the memory portion 2132. For example, a NAND type nonvolatile memory with a storage capacity of 20 to 200 gigabytes (GBs) is used and the operation portion 2133 is operated, whereby an image or sound (music) can be recorded and reproduced. Note that power consumption of the display portion 2131 can be suppressed by displaying white characters on a black background. This is effective especially in a mobile audio device. Note that the nonvolatile memory provided in the memory portion 2132 may be removable.

Figure 15E:
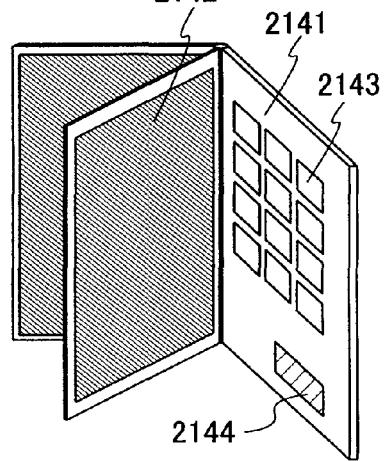

FIG. 15E shows an electronic book (also called an electronic paper). The electronic book includes a main body 2141, a display portion 2142, operation keys 2143, and a memory portion 2144. Further, a modem may be built in the main body 2141, or information may be sent and received wirelessly. The nonvolatile memory formed using the present invention can be used for the memory portion 2144. For example, a NAND type nonvolatile memory with a storage capacity of 20 to 200 gigabytes (GBs) is used and the operation keys 2143 are operated, whereby an image or sound (music) can be recorded and reproduced. Note that the nonvolatile memory provided in the memory portion 2144 may be removable.

As described above, the nonvolatile memory of the present invention can be applied in an extremely wide range, and can be applied to electronic appliances of various fields as long as a memory is included.

This embodiment mode can be combined with another embodiment mode as needed in this specification.

This application is based on Japanese Patent Application Serial No. 2006-194660 filed in Japan Patent Office on 14 Jul. 2006, the entire contents of which are hereby incorporated by reference.

What is claimed is:

1. A nonvolatile memory comprising:
a memory cell array in which a plurality of memory cells are arranged in a matrix in row and column directions;
a plurality of first word lines;
a plurality of second word lines; and
a plurality of bit lines, wherein:
in the plurality of memory cells, each of a first memory cell and a second memory cell includes a first memory transistor and a second memory transistor which are connected in series;
a gate electrode of the first memory transistor of the first memory cell is connected to one of the first word lines;
a gate electrode of the second memory transistor of the first memory cell is connected to one of the second word lines;
one of a source region and a drain region of the first memory transistor of the first memory cell is connected to a first bit line;
one of a source region and a drain region of the first memory transistor of the first memory cell is connected to a second bit line;
one of a source region and a drain region of the first memory transistor of the second memory cell is connected to a second bit line; and
one of a source region and a drain region of the second memory transistor of the second memory cell is connected to a third bit line.

2. The nonvolatile memory according to claim 1, wherein the nonvolatile memory can write data for each bit and erase data for each bit.

3. The nonvolatile memory according to claim 1, wherein data writing into and data erasing from the plurality of memory cells are performed by a tunneling current.

4. The nonvolatile memory according to claim 1, wherein the first and second memory transistors are n-channel transistors.

5. The nonvolatile memory according to claim 1, wherein the first and second memory transistors are p-channel transistors.

6. A semiconductor device having the nonvolatile memory according to claim 1 further comprising an antenna.

7. An electronic appliance having the nonvolatile memory according to claim 1, wherein the electronic appliance is selected form the group consisting of a video camera, a digital camera, a goggle type display, a head-mounted display, a navigation system, an audio reproducing device, a car audio set, an audio component set, a computer, a game machine, a portable information terminal, a mobile computer, a mobile phone, a portable game machine, an electronic book, and an image reproducing device provided with a recording medium.

8. A nonvolatile memory comprising:

a memory cell array in which (m×n) number of memory cells are arranged in a matrix of m number of rows and n number of columns (m and n are integers which are greater than or equal to 1);

m number of first word lines;

m number of second word lines; and (n+1) number of bit lines in which a first bit line and a second bit line are provided to be adjacent to each other and the second bit line and a third bit line are provided to be adjacent to each other, wherein:

the second bit line is located between the first bit line and the third bit line;

each of the memory cells includes a first memory transistor and a second memory transistor which are connected in series;

a gate electrode of the first memory transistor is connected to one of the first word lines;

a gate electrode of the second memory transistor is connected to one of the second word lines;

the first bit line is connected to one of a source region and a drain region of each second memory transistor provided in memory cells in a (j−1)th column and one of a source region and a drain region of each first memory transistor provided in memory cells in a j-th column (j is an integer which is greater than or equal to 2 and less than or equal to n−2); and the second bit line is connected to one of a source region and a drain region of each second memory transistor provided in the memory cells in the j-th column and one of a source region and a drain region of each first memory transistor provided in memory cells in a (j+1)th column; and the third bit line is connected to one of a source region and a drain region of each second memory transistor provided in the memory cells in the (j+1)th column and one of a source region and a drain region of each first memory transistor provided in memory cells in a (j+2)th column.

9. The nonvolatile memory according to claim 8, wherein the nonvolatile memory can write data for each bit and erase data for each bit.

10. The nonvolatile memory according to claim 8, wherein data writing into and data erasing from the plurality of memory cells are performed by a tunneling current.

11. The nonvolatile memory according to claim 8, wherein the first and second memory transistors are n-channel transistors.

12. The nonvolatile memory according to claim 8, wherein the first and second memory transistors are p-channel transistors.

13. A semiconductor device having the nonvolatile memory according to claim 8 further comprising an antenna.

14. An electronic appliance having the nonvolatile memory according to claim 8, wherein the electronic appliance is selected form the group consisting of a video camera, a digital camera, a goggle type display, a head-mounted display, a navigation system, an audio reproducing device, a car audio set or an audio component set, a computer, a game machine, a portable information terminal, a mobile computer, a mobile phone, a portable game machine, an electronic book, and an image reproducing device provided with a recording medium.

15. A nonvolatile memory comprising:

a first memory cell and a second memory cell, each of the first memory cell and the second memory cell including a first memory transistor and a second memory transistor;

a first word line;

a second word line;

a first bit line;

a second bit word line; and a third bit line, wherein:

a gate electrode of the first memory transistor of the first memory cell and a gate electrode of the first memory transistor of the transistor cell are connected to the first word line;

a gate electrode of the second memory transistor of the first memory cell and a gate electrode of the second memory transistor of the second memory cell are connected to the second word line;

one of a source region and a drain region of the first memory transistor of the first memory cell is connected to the first bit line;

one of a source region and a drain region of the second memory transistor of the first memory cell is connected to the second bit line;

one of a source region and a drain region of the first memory transistor of the second memory cell is connected to the second bit line; and one of a source region and a drain region of the second memory transistor of the second memory cell is connected to the third bit line.

16. The nonvolatile memory according to claim 15, wherein the nonvolatile memory can write data for each bit and erase data for each bit.

17. The nonvolatile memory according to claim 15, wherein data writing into and data erasing from the first and second memory cells are performed by a tunneling current.

18. The nonvolatile memory according to claim 15, wherein the first and second memory transistors of the first memory cell are n-channel transistors.

19. The nonvolatile memory according to claim 15, wherein the first and second memory transistors of the first memory cell are p-channel transistors.

20. A semiconductor device having the nonvolatile memory according to claim 15 further comprising an antenna.

21. An electronic appliance having the nonvolatile memory according to claim 15, wherein the electronic appliance is selected bum the group consisting of a video camera, a digital camera, a goggle type display, a head-mounted display, a navigation system, an audio reproducing device, car audio set, an audio component set, a computer, a game machine, a portable informational terminal, a mobile computer, a mobile phone, a portable game machine, an electronic book, and an image reproducing device provided with a recording medium.

22. The nonvolatile memory according to claim 1, wherein both of the first memory transistor and the second memory transistor of the first memory cell are formed from an island-shaped semiconductor film.

23. The nonvolatile memory according to claim 8, wherein both of the first memory transistor and the second memory transistor of the first memory cell are formed from an island-shaped semiconductor film.

24. The nonvolatile memory according to claim 15, wherein both of the first memory transistor and the second memory transistor of the first memory cell are formed from an island-shaped semiconductor film.

* * * * *